US010587257B2

United States Patent
Cyr et al.

(10) Patent No.: US 10,587,257 B2
(45) Date of Patent: Mar. 10, 2020

(54) COMMUTATION CELL AND COMPENSATION CIRCUIT THEREFOR

(71) Applicant: TM4 INC., Boucherville (CA)

(72) Inventors: Jean-Marc Cyr, Candiac (CA); Maalainine El Yacoubi, Montréal (CA); Pascal Fleury, Sainte-Madeleine (CA); Mohammed Amar, Montréal (CA)

(73) Assignee: TM4 Inc., Boucherville (CA)

( * ) Notice: Subject to any disclaimer, the term of this patent is extended or adjusted under 35 U.S.C. 154(b) by 0 days.

(21) Appl. No.: 14/781,491

(22) PCT Filed: Apr. 4, 2014

(86) PCT No.: PCT/CA2014/000325
§ 371 (c)(1),
(2) Date: Sep. 30, 2015

(87) PCT Pub. No.: WO2014/161080
PCT Pub. Date: Oct. 9, 2014

(65) Prior Publication Data
US 2016/0043711 A1   Feb. 11, 2016

Related U.S. Application Data

(60) Provisional application No. 61/904,038, filed on Nov. 14, 2013, provisional application No. 61/808,254, filed on Apr. 4, 2013.

(51) Int. Cl.
G05F 3/08 (2006.01)
H03K 17/08 (2006.01)
(Continued)

(52) U.S. Cl.
CPC .............. *H03K 17/08* (2013.01); *H02M 1/32* (2013.01); *H02P 6/14* (2013.01); *H03K 17/082* (2013.01);
(Continued)

(58) Field of Classification Search
CPC ... H02M 1/32; H02P 6/14; H02P 1/02; H03K 17/08; H03K 17/082; H03K 17/166; H03K 17/168; H01R 9/2475; H05K 1/00
See application file for complete search history.

(56) References Cited

U.S. PATENT DOCUMENTS

2003/0021131 A1* 1/2003 Nadot ............... H02M 1/34
363/55
2010/0089670 A1   4/2010 Lee et al.
2011/0065161 A1* 3/2011 Kwasinski ............ A23L 3/32
435/173.1

FOREIGN PATENT DOCUMENTS

CN   102891669 A   1/2013
EP   0980141 A1   2/2000
(Continued)

OTHER PUBLICATIONS

Azeroual, E., and Cyr, J. "Limiting the Overshoot on IGBT During Turn-Off Using Stray Inductance". ATZ elektronik, May 2012, vol. 7.*

(Continued)

*Primary Examiner* — Muhammad S Islam
(74) *Attorney, Agent, or Firm* — McCoy Russell LLP

(57) ABSTRACT

The present disclosure relates to a commutation cell and to a compensation circuit for limiting overvoltage across the power electronic switch of the commutation cell and for limiting a recovery current in a freewheel diode of the commutation cell. The power electronic switch has a parasitic emitter inductance. A variable gain compensation circuit generates a feedback from a voltage generated across (Continued)

the parasitic inductance of the emitter of the power switch at turn-on or turn-off of the power electronic switch. The compensation circuit provides the feedback to a control of the power electronic switch to reduce the voltage generated on the parasitic emitter inductance. A power converter including the commutation cell with the compensation circuit is also disclosed.

13 Claims, 21 Drawing Sheets

(51) Int. Cl.
    *H03K 17/082*     (2006.01)
    *H02M 1/32*       (2007.01)
    *H02P 6/14*       (2016.01)
    *H03K 17/16*      (2006.01)
    *H03K 17/567*     (2006.01)
(52) U.S. Cl.
    CPC ............... *H01L 2224/48091* (2013.01); *H01L 2224/49111* (2013.01); *H01L 2224/49175* (2013.01); *H01L 2924/13055* (2013.01); *H01L 2924/13091* (2013.01); *H03K 17/166* (2013.01); *H03K 17/168* (2013.01); *H03K 17/567* (2013.01)

(56) References Cited

FOREIGN PATENT DOCUMENTS

| GB | 2493562 A    | 2/2013  |
|----|--------------|---------|
| JP | 2008-235997 A | 10/2008 |
| WO | 2013/082705  | 6/2013  |
| WO | 2014/043795  | 3/2014  |

OTHER PUBLICATIONS

"Fundamental of Electronic Circuit design" by David Comer and Donald Comer, p. 146, Figure 5.17; http://www.wiley.com/college/comer, 2003.*

Azeroual, E., and Cyr, J. "Limiting the Overshoot on IGBT During Turn-Off Using Stray Inductance". ATZ elektronik, May 2012, vol. 7. (Year: 2012).*

Meloncelli (AN1315: Application Note; STMicroelectronics; Jan. 2001) (Year: 2001).*

Azeroual et al., "Limiting the Overshoot on IGBT During Turn-Off Using Stray Inductance," ATZ elektronik, 2012, vol. 7, pp. 16-20.

Cyr, Presentation made on Apr. 18, 2013: "Reducing switching losses with Reflex(TM) Gate Driver Technology," pp. 1-30.

Cyr et al., "Reducing switching losses and increasing IGBT drive efficiency with Reflex(TM) gate driver technology," published on Apr. 23, 2013, pp. 1-12.

PCT International Search Report and Written Opinion of International Searching Authority for International Patent Application No. PCT/CA2014/000325, dated Jul. 9, 2014, 9 pages.

Cyr et al., "Limiting the overshoot on IGBT during turn-off using stray inductance," International Conference and Exhibition Automotive Power Electrics, vol. 812, Apr. 7, 2011, 11 pages.

Supplementary European Search Report for EP Appln. No. EP 14779957, date of completion: Oct. 17, 2016, 13 pages.

English Translation of the First Office Action for Chinese Patent Application No. 201480024860.7, dated Dec. 6, 2017, 10 pages.

* cited by examiner

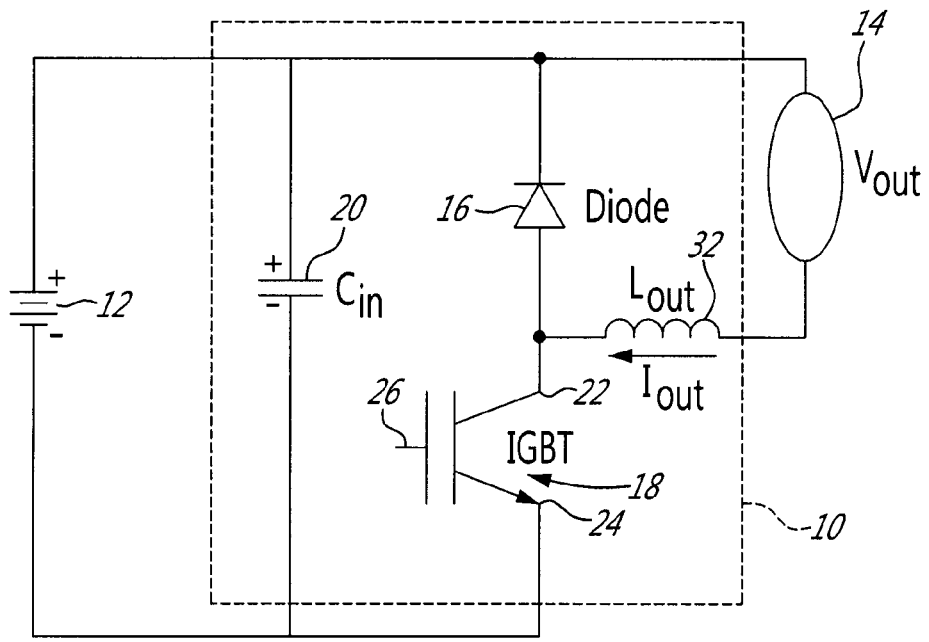
_FIG_1
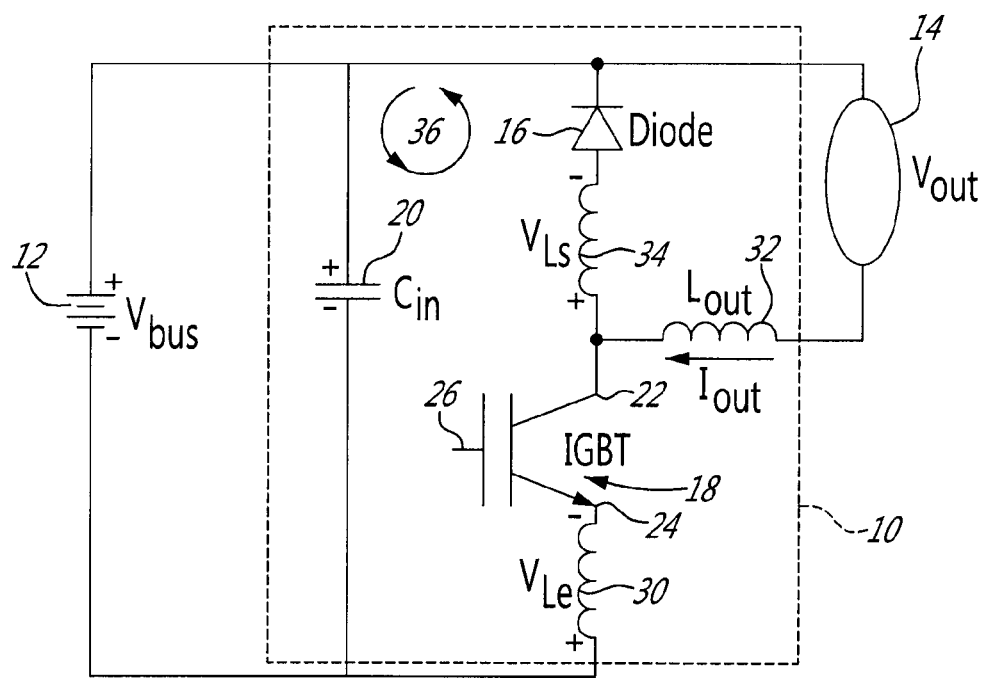
_FIG_2

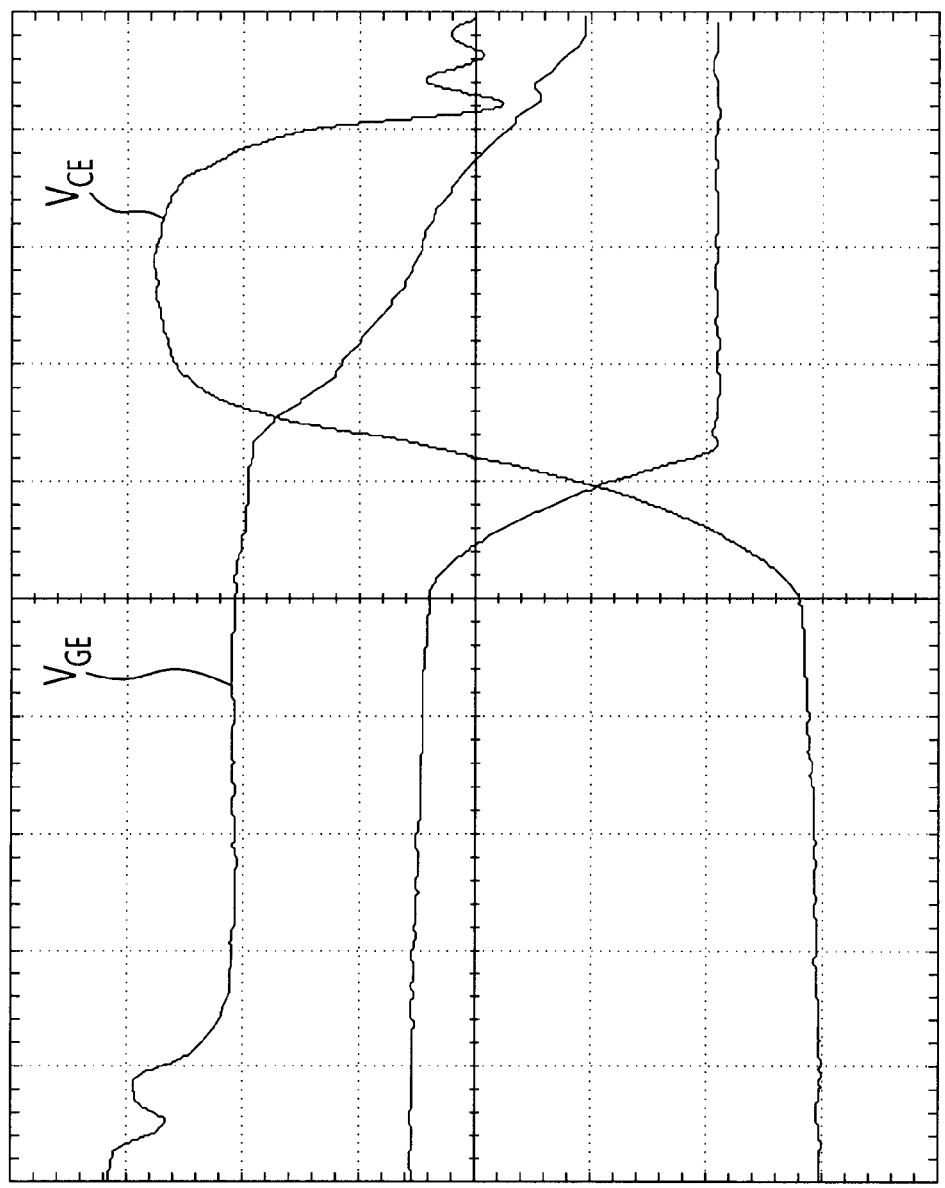

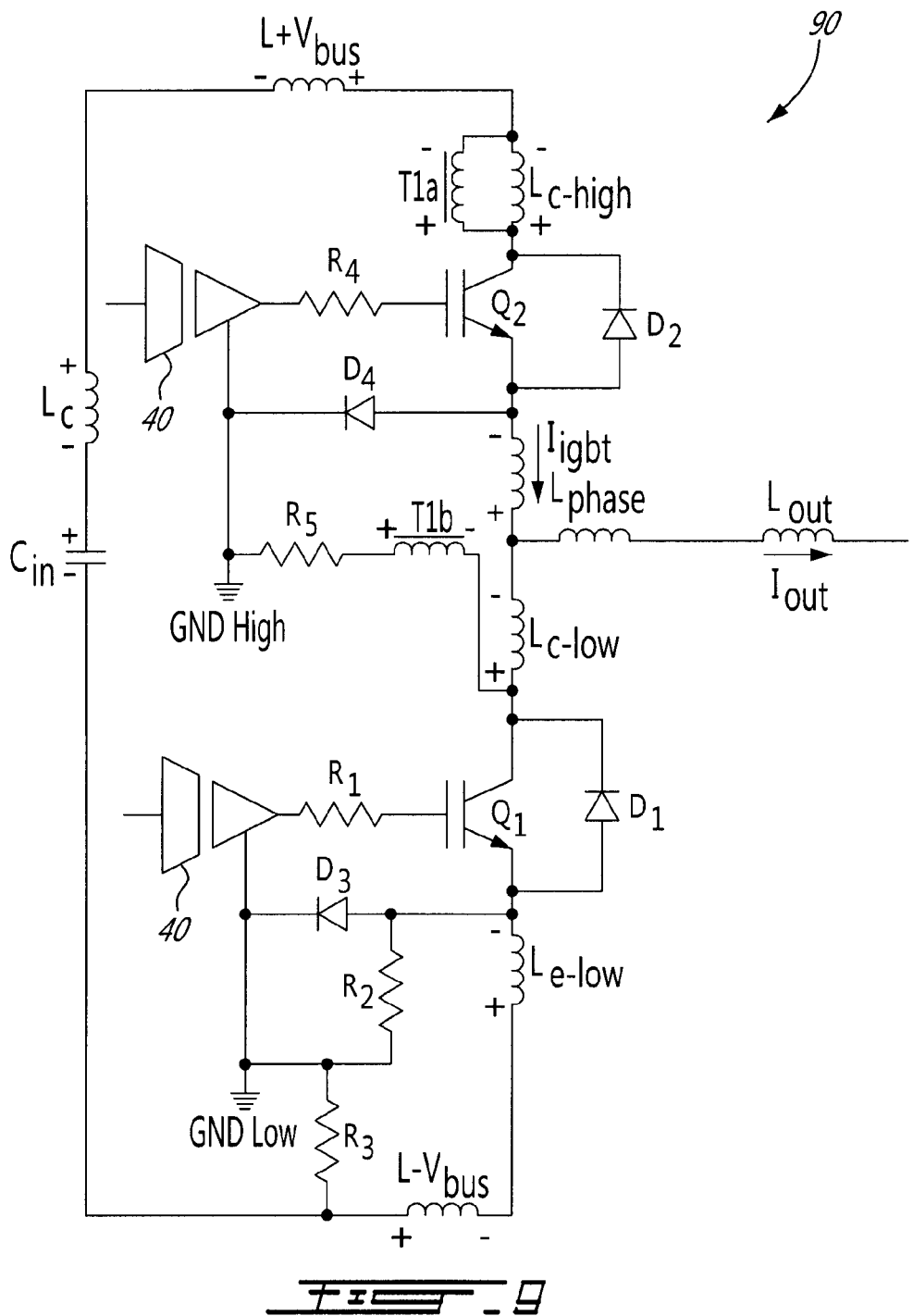

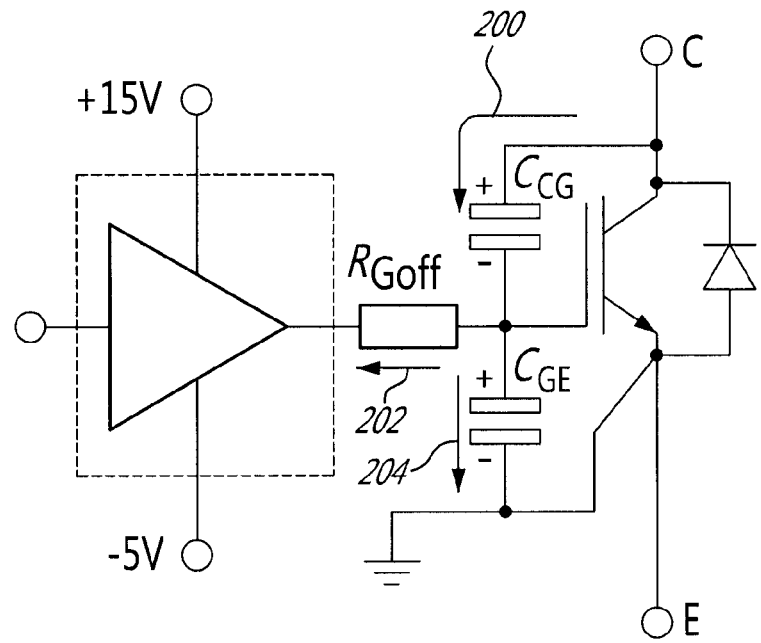
_FIG. 13_
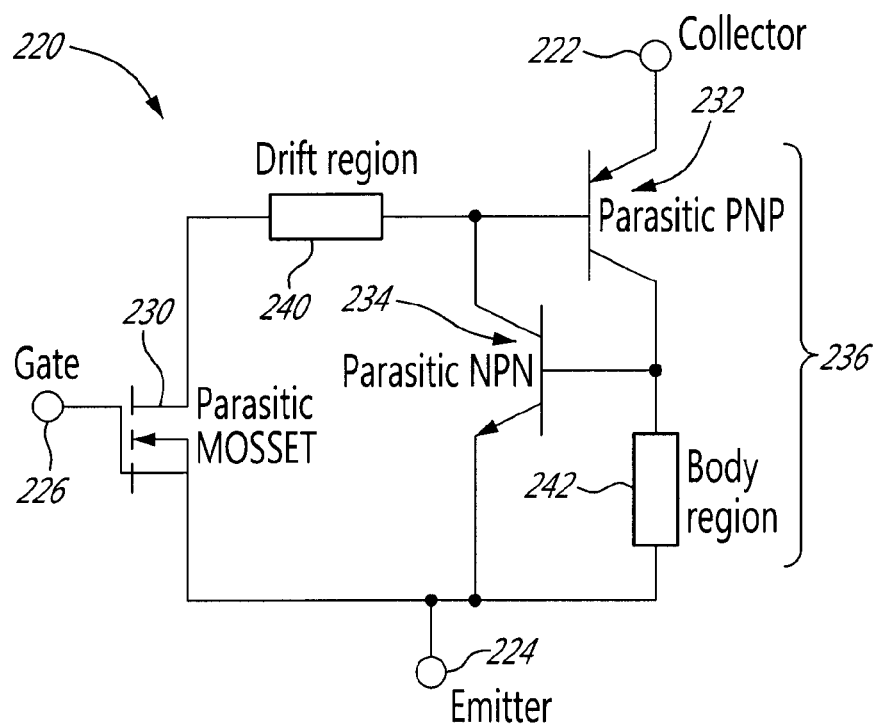
_FIG. 14_

COMMUTATION CELL AND COMPENSATION CIRCUIT THEREFOR

CROSS REFERENCE TO RELATED APPLICATIONS

This application is a national phase under 35 U.S.C. § 371 of International Application No. PCT/CA2014/000325 filed on Apr. 4, 2014, which claims priority to and the benefit of U.S. Provisional Ser. No. 61/808,254 filed on Apr. 4, 2013 and U.S. Provisional Ser. No. 61/904,038 filed on Nov. 14, 2013, and the entirety of these applications is incorporated by reference herein.

TECHNICAL FIELD

The present disclosure relates to the field of power electronics. More specifically, the present disclosure relates to a commutation cell configured for limiting switching overvoltage at turn-on and turn-off of the power electronic switch and for controlling the recovery current in a freewheel diode of the commutation cell at turn-on of the power electronic switch. The present disclosure further relates to a compensation circuit for use in a commutation cell and to a power converter including the commutation cell with the compensation circuit.

BACKGROUND

Commutation cells are commonly used in electronic systems that require conversion of a voltage source, including both DC-DC converters and DC-AC converters, which are often called inverters. With the limited space allowed for power converter circuits, such as those used for example in electric and/or electric hybrid automotive applications, and given the high cost of the semi-conductors, the demand for integration of these commutation cells increases.

A known way of reducing the space occupied by semi-conductors in power converter circuits is to increase their efficiency to allow the size of the cooling surface to be reduced.

Losses in power electronic switches present in conventional power converter circuits are mainly caused by two sources; conduction losses and switching losses. One way to reduce switching losses is generally by accelerating turn-on and turn-off of the power electronic switches. However, fast turn-off of the power electronic switches generates overvoltage in stray inductances of their high-frequency loop. It is thus often required to slow down turning off of the power electronic switches to protect them against overvoltage. This may seriously impact the overall efficiency of conventional power converter circuits.

FIG. 1 is an idealized circuit diagram of a conventional commutation cell such as those used in conventional power converter circuits. A commutation cell 10 converts a DC voltage $V_{bus}$ from a voltage source 12 (or from a capacitor) into a current source $I_{out}$ (or into an inductance) that usually generates a voltage $V_{out}$ appropriate for a load 14, which may be a resistive load, an electric motor, and the like. The commutation cell 10 comprises a freewheel diode 16 and a controlled power electronic switch 18, for example an isolated gate bipolar transistor (IGBT). A capacitor 20 ($C_{in}$) is used to limit variations of the voltage $V_{bus}$ of the voltage source 12 and an inductance 32 is used to limit the variations of the output current $I_{out}$. A gate driver (not shown in FIG. 1 but shown on later Figures) controls turning on and off of the power electronic switch 18. FIG. 1 illustrates a configuration of the commutation cell 10, of the load 14, and of the voltage source 12, in which energy flows from the voltage source 12 to the load 14, i.e. from left to right on the drawing. The commutation cell 10 can also be used in a reverse configuration in which energy flows in the opposite direction.

When turned on, the power electronic switch 18 allows current to pass therethrough, from its collector 22 to its emitter 24. The power electronic switch 18 can be approximated as a closed circuit. When turned off, the power electronic switch 18 does not allow current to pass therethrough and becomes an open circuit.

The gate driver applies a variable control voltage between the gate 26 and the emitter 24 of the power electronic switch 18. For some types of power electronic switches such as bipolar transistors, the gate driver may act as a current source instead of as a voltage source. Generally, when the voltage applied between the gate 26 and the emitter 24 is "high", the power electronic switch 18 allows passing of current from the collector 22 to the emitter 24. When the voltage applied between the gate 26 and the emitter 24 is "low", the power electronic switch 18 blocks passage of current therethrough. In more details, a voltage difference between the gate 26 and the emitter 24, denoted $V_{ge}$, is controlled by the gate driver. When $V_{ge}$ is greater than a threshold $V_{ge(th)}$ for the power electronic switch 18, the switch 18 is turned on and a voltage $V_{ce}$ between the collector 22 and the emitter 24 becomes near zero. When $V_{ge}$ is lower than $V_{ge(th)}$, the power electronic switch 18 is turned off and $V_{ce}$ eventually reaches $V_{bus}$.

When the power electronic switch 18 is turned on, a current $I_{out}$ flows from the voltage source 12 (and transiently from the capacitor 20) through the load 14 and through the collector 22 and the emitter 24. When the power electronic switch 18 is turned off, the current $I_{out}$ circulates from the load 14 and passes in the freewheel diode 16. It may thus be observed that the power electronic switch 18 and the freewheel diode 16 operate in tandem. Turning on and off of the power electronic switch 18 at a high frequency allows the current $I_{out}$, in the output inductance $L_{out}$ 32, to remain fairly constant.

It should be observed that, in the case of other power electronic switch types, for example bipolar transistors, the term "gate" may be replaced with "base", the base being controlled by a current as opposed to the gate that is controlled by a voltage. These distinctions do not change the overall operation principles of the commutation cell 10.

FIG. 2 is another circuit diagram of the conventional commutation cell of FIG. 1, showing parasitic inductances. In contrast with the idealized model of FIG. 1, connections between components of an actual commutation cell define parasitic (stray) inductances. Though the parasitic inductances are distributed at various places within the commutation cell 10, a suitable model presented in FIG. 2 shows two (2) distinct inductances representing the overall parasitic inductance, including an emitter inductance 30 of the power electronic switch 18 and an inductance 34 representative of all other parasitic inductances (other than the emitter inductance 30) around a high frequency loop 36 formed by the freewheel diode 16, the power electronic switch 18 and the capacitor 20. The high frequency loop 36 is a path where current changes significantly upon switching of the power electronic switch 18. It should be noted that an output inductance $L_{out}$ 32 is not part of the high frequency loop because its current remains fairly constant through the commutation period.

FIG. 3 is a circuit diagram of a conventional commutation cell further showing a gate driver 40. Some elements of the commutation cell 10 are not shown on FIG. 3, in order to simply the illustration. FIG. 3 further shows a gate driver 40 having a positive supply voltage 42 and a negative supply voltage 44, an output 46 of the gate driver 40 being connected to the gate 26 of the power electronic switch 18 via a gate resistor $R_g$. The positive supply voltage 42 of the gate driver 40 has a value denoted $+V_{cc}$, for example +15 volts above a ground reference (shown on a later Figure) while the negative supply voltage 44 has value denoted $-V_{dd}$, for example −5 volts below the ground reference. An input 50 of the gate driver 40 is connected to a controller (not shown) of the commutation cell 10, as is well known in the art. A voltage at the output 46 of the gate driver 40 goes up to $+V_{cc}$ and goes down to $-V_{dd}$ in order to control the voltage at the gate 26. The input resistance of the gate 26 to emitter may be very high, especially in the case of an IGBT. However, a parasitic capacitance $C_{ge}$ (shown on a later Figure), present between the gate 26 and the emitter 24, causes some current to flow from the output 46 when the gate driver 40 alternates between $+V_{cc}$ and $-V_{dd}$. The value $R_g$ of the gate resistor is selected as a function of the parasitic capacitance $C_{ge}$ and of a desired switching rate of the power electronic switch 18 so that the voltage at the gate 26 changes at rate appropriate for the desired switching rate.

On FIG. 3, a current $I_{igbt}$ flowing through the power electronic switch 18 and through the emitter parasitic inductance 30 is essentially equal to $I_{out}$ when the power electronic switch 18 is closed, and quickly reduces to zero (substantially) when the power electronic switch 18 turns off.

When the power electronic switch 18 turns on or off, the current $I_{igbt}$ flowing therethrough increases or diminishes at a fast rate. These variations of $I_{igbt}$, denoted di/dt, generate voltage across inductances 30 and 34, according to the well-known equation (1):

$$V_L = L \cdot \frac{di}{dt} \tag{1}$$

wherein $V_L$ is a voltage induced across an inductance and L is an inductance value.

A voltage $V_{Ls}$ is generated across the parasitic inductance 34 and a voltage $V_{Le}$ is generated across the emitter parasitic inductance 30. On FIGS. 2 and 3, the polarities shown across the high frequency loop inductance 34, including the emitter inductance 30 reflect voltages obtained upon turn-off of the power electronic switch 18, when the $I_{igbt}$ current diminishes very rapidly, di/dt thus taking a negative value. Upon turn-on of the power electronic switch 18, voltages across the high frequency loop inductance 34, including the emitter inductance 30 are in the opposite direction.

These voltages $V_{Ls}$ and $V_{Le}$ are in series with $V_{bus}$ from the voltage source 12. When the power electronic switch 18 turns off, the collector 22 to emitter 24 voltage increases until the freewheel diode 16 turns on. At that time, addition of $V_{bus}$, $V_{Ls}$ and $V_{Le}$ results in an important overvoltage applied between the collector 22 and the emitter 24 of the power electronic switch 18. Though power electronic switches are rated for operation at some level of voltage, extreme overvoltage can reduce the lifetime of any power electronic switch to thereby lead to its premature failure or even break the device.

FIG. 4 is a circuit diagram of a conventional IGBT leg formed of two conventional commutation cells. Two commutation cells 10 introduced in the above description of FIGS. 1-3, in which IGBTs are used as power electronic switches 18 in the example of FIG. 4, are connected in a single loop to form an IGBT leg 70. A first power electronic switch (bottom IGBT $Q_1$) operates in tandem with a first freewheel diode (top freewheel diode $D_2$) and a second power electronic switch (top IGBT $Q_2$) operates in tandem with another freewheel diode (bottom freewheel diode $D_1$). Each IGBT has its own gate driver 40. A voltage source (not shown) provides a voltage $V_{bus}$ in parallel to an input capacitance 20 ($C_{in}$) connected to the IGBT leg 70 via a parasitic inductance $L_c$. Inductances inherently provided in wires, connections, decoupling capacitor and circuit board traces of a power converter have been represented in FIG. 4. A three-phase power converter used for powering a three-phase electric motor (not shown) from a battery (also not shown), would comprise three (3) IGBT legs 70 as shown on FIG. 4. Since such power converters are believed well-known, they are not described in further details herein.

As can be seen from FIG. 4, a reference of each gate driver is connected to the emitter of the IGBT $Q_1$ and $Q_2$, typically known as logical pins of the IGBTs $Q_1$ and $Q_2$. For concision purpose, a description of FIG. 4 focuses on its bottom portion including the bottom IGBT $Q_1$.

The overvoltage effect on a power electronic switch 18, discussed in the above description of FIGS. 2 and 3, also applies to the IGBTs $Q_1$ and $Q_2$. When the bottom IGBT $Q_1$ is turned off, current transits from the bottom IGBT $Q_1$ to the top freewheel diode $D_2$, during an overvoltage period. A properly selected IGBT is able to support the overvoltage created by a current variation (c/i/dt) across various parasitic inductances ($L_c$, $L_{+Vbus}$, $L_{c\text{-}high}$, $L_{e\text{-}high}$, $L_{c\text{-}low}$, $L_{e\text{-}low}$ and $L_{-Vbus}$) present in the IGBT leg 70. Indeed, since the inductances resist change of current therein, additive voltages develop in the IGBT leg 70 as illustrated by the polarities of the parasitic inductances shown on in FIG. 4. These voltages, added to the voltage $V_{bus}$ of the source, often result in a voltage exceeding the maximal collector to emitter voltage $V_{ce}$ rating of the bottom IGBT $Q_1$. The top IGBT $Q_2$ is subject to the same problem.

FIG. 5 is a diagram showing current and voltage waveforms at turn-off of the IGBTs of FIG. 4. The collector to emitter voltage $V_{ce}$, the gate to emitter voltage $V_{ge}$ and a current I flowing from the collector to the emitter of the IGBT $Q_1$ are shown at turn-off. It may be observed that there is a major overvoltage (peak) of $V_{ce}$, above the voltage of the source $V_{bus}$, at the time of turn-off.

Solutions exist that tend to limit overvoltage in power electronic switches by slowing down the slope of the gate-emitter voltage. However, excessive limitation of the overvoltage can imply longer switching times of the current, reducing commutation cell performance.

Also, when the power electronic switch 18 turns on, current starts flowing between the collector 22 and the emitter 24. Current flowing through the freewheel diode 16 concurrently diminishes until the entire current $I_{out}$ flows through the power electronic switch 18. An additional current, called a recovery current, circulates in the power electronic switch 18 so that some current circulates in the reverse direction of the freewheel diode 16 until all charges deposited on its junction are removed. The freewheel diode 16 then turns off, allowing voltage to build thereon while voltage between the collector 22 and the emitter 24 of the power electronic switch 18 reduces substantially to zero. When the freewheel diode 16 blocks, the reverse flowing current causes an abrupt voltage increase that in turn causes oscillations between a parasitic capacitance (not explicitly shown) of the freewheel diode 16 and inductances 30 and 34 of the high frequency loop 36.

It is thus important to control the di/dt when turning on the power electronic switch 18 since an excessively abrupt drop in voltage could inject current in the gate of an opposite power electronic switch (not shown), causing the opposite power electronic switch to become conductive while the power electronic switch 18 is still conductive. The di/dt also generates important and undesirable electromagnetic interference (EMI).

Therefore, there is a need for methods and circuits capable of reducing overvoltage occurring upon switching in commutation cells and to control the di/dt at turn-on of the power electronic switch without undue switching delays.

SUMMARY

According to the present disclosure, there is provided a commutation cell configured for limiting switching overvoltage and for limiting recovery current. The commutation cell comprises a power electronic switch having a parasitic emitter inductance through which a voltage is generated upon turning on and off of the power electronic switch. The commutation cell also comprises a compensation circuit connected to the parasitic emitter inductance. The compensation circuit applies a sample of the voltage generated through the parasitic emitter inductance at turn-on and turn-off of the power electronic switch to control the voltage generated through the parasitic emitter inductance.

According to the present disclosure, there is also provided a power converter, comprising two of the commutation cells configured for limiting switching overvoltage and for limiting recovery current. The two commutation cells form a loop and are connected at a junction of a collector of a first power electronic switch of a first commutation cell and of an emitter of a second power electronic switch of a second commutation cell.

The present disclosure further relates to a compensation circuit for limiting switching overvoltage on a power electronic switch of a commutation cell, the commutation cell including a high frequency loop having a parasitic inductance through which a voltage is generated upon turning off of the power electronic switch, the high frequency loop parasitic inductance including a parasitic emitter inductance of the power electronic switch. The compensation circuit comprises a voltage divider configured to provide a gain of a voltage generated on the parasitic emitter inductance at turn-on and at turn-off of the power electronic switch. The compensation circuit also comprises a connection from the voltage divider to provide a feedback voltage to the power electronic switch gate driver according to the gain to reduce the voltage generated on the parasitic inductance of the high frequency loop.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which:

FIG. 1 is an idealized circuit diagram of a conventional commutation cell such as those used in conventional power converter circuits;

FIG. 2 is another circuit diagram of the conventional commutation cell of FIG. 1, showing parasitic inductances;

FIG. 8 is a diagram showing current and voltage waveforms at turn-off of the IGBTs of FIG. 6, the resistive divider being adjusted for a maximum bus voltage of 300 volts in short circuit condition;

FIG. 9 is a circuit diagram of an IGBT leg using a transformer to increase an apparent emitter inductance, according to another embodiment;

FIG. 13 is a schematic representation of IGBT capacitances including a Miller Capacitance;

FIG. 14 is an illustration of an equivalent circuit of a typical IGBT;

DETAILED DESCRIPTION

Like numerals represent like features on the various drawings.

Various aspects of the present disclosure generally address one or more of the problems of overvoltage and recovery current present in commutation cells at the time of switching.

Circuits operable to limit overvoltage in commutation cells, especially at turn-off of IGBTs, are described in international patent publication no WO 2013/082705 A1, in international patent application no PCT/CA2013/000805, in U.S. provisional applications No. 61/808,254 and no 61/904,038, and in "Reducing switching losses and increasing IGBT drive efficiency with Reflex™ gate driver technology", available at http://www.advbe.com/docs/DeciElec2013-Jean_Marc_Cyr-TM4.pdf, all of which are authored by Jean-Marc Cyr et al. the disclosure of these being incorporated by reference herein.

The present technology provides control of overvoltage and switching losses at turn-on and turn-on as well as a reduction of recovery current at turn-on of a power electronic switch of a commutation cell. Circuits and methods presented herein are generally compatible with solutions to limit overvoltage at turn-off of power electronic switches.

In a commutation cell, di/dt at turn-off of a power electronic switch generates a voltage across stray inductances of a high frequency loop of the commutation cell. This voltage is applied across the power electronic switch in addition to a bus voltage providing power to the commutation cell. The present disclosure introduces a solution based on the injection of a sample of the overvoltage present across the power electronic switch to a gate driver of the power electronic switch. This injection slows down a variation of the gate voltage. This, in turn, decreases an amount overvoltage on the power electronic switch. The effect can be limited to only occur during a period when the overvoltage is above a predetermined value. By precisely controlling the di/dt, overvoltage of the power electronic switch can be controlled while an opposite freewheel diode operating in tandem with power electronic switch turns off. This technique allows the power electronic switch to be rapidly turned on while preventing damage due to overvoltage.

The techniques disclosed herein will mainly be described in relation to the use of isolated gate bipolar transistors (IGBT). Mentions of IGBTs in the following description are made for illustration purposes and are not meant to limit the present disclosure. The same techniques may equally be applied to commutation cells constructed using metal-oxide-semiconductor field-effect transistors (MOSFET), bipolar transistors and like power electronic switches.

Figure 3:
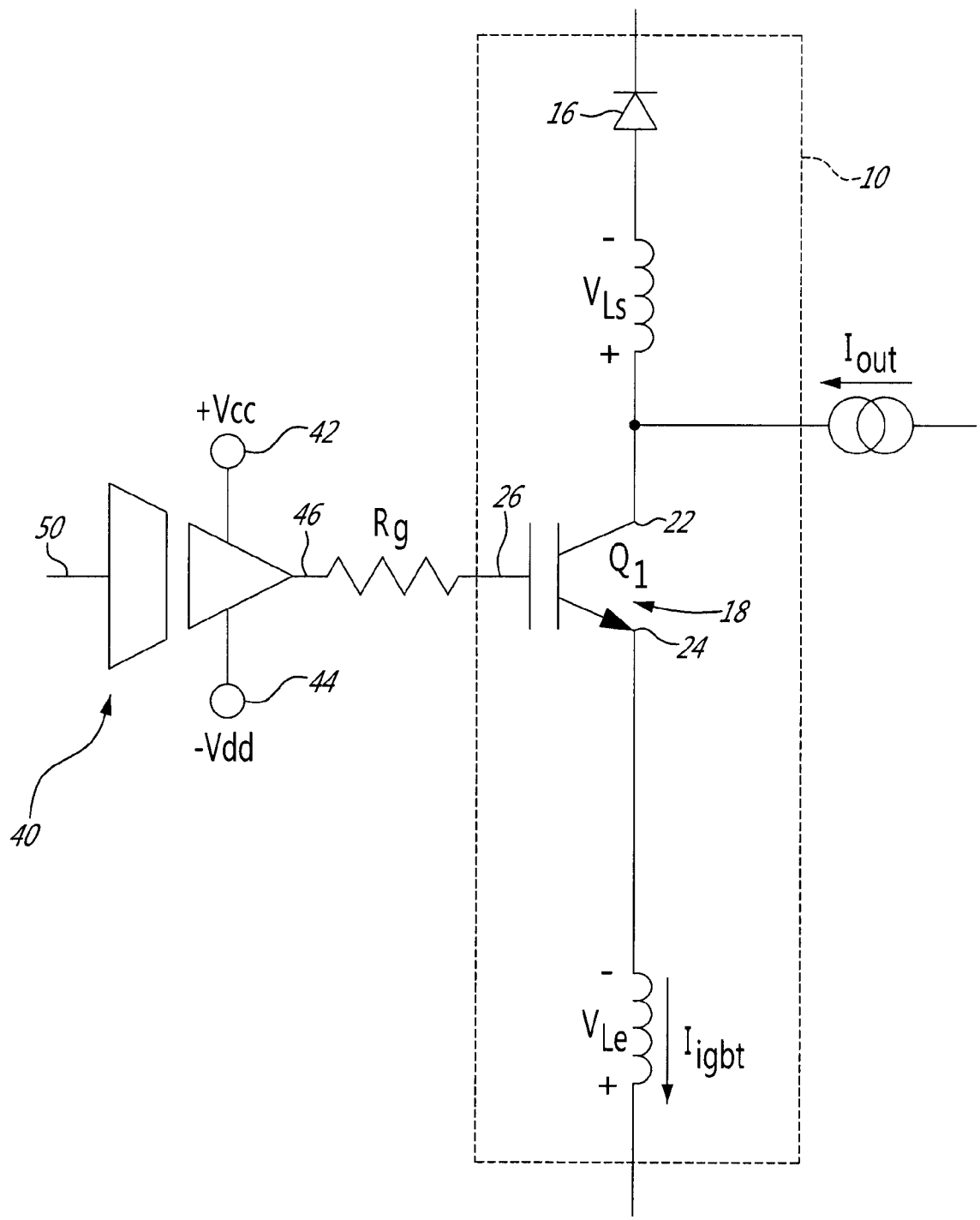
FIG. 3 is a circuit diagram of a conventional commutation cell further showing a gate driver.
Figure 4:
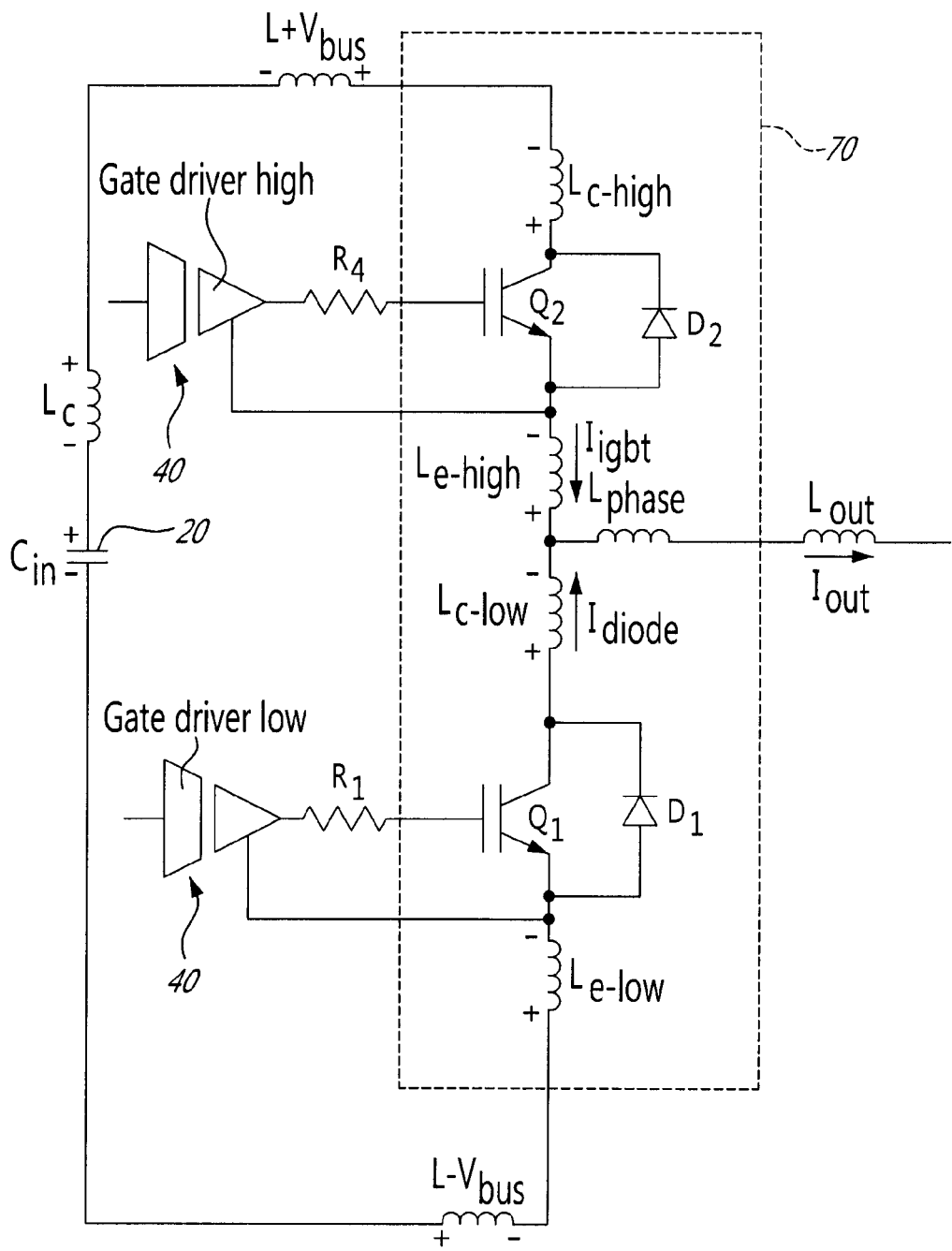
FIG. 4 is a circuit diagram of a conventional IGBT leg formed of two conventional commutation cells.
Figure 5:
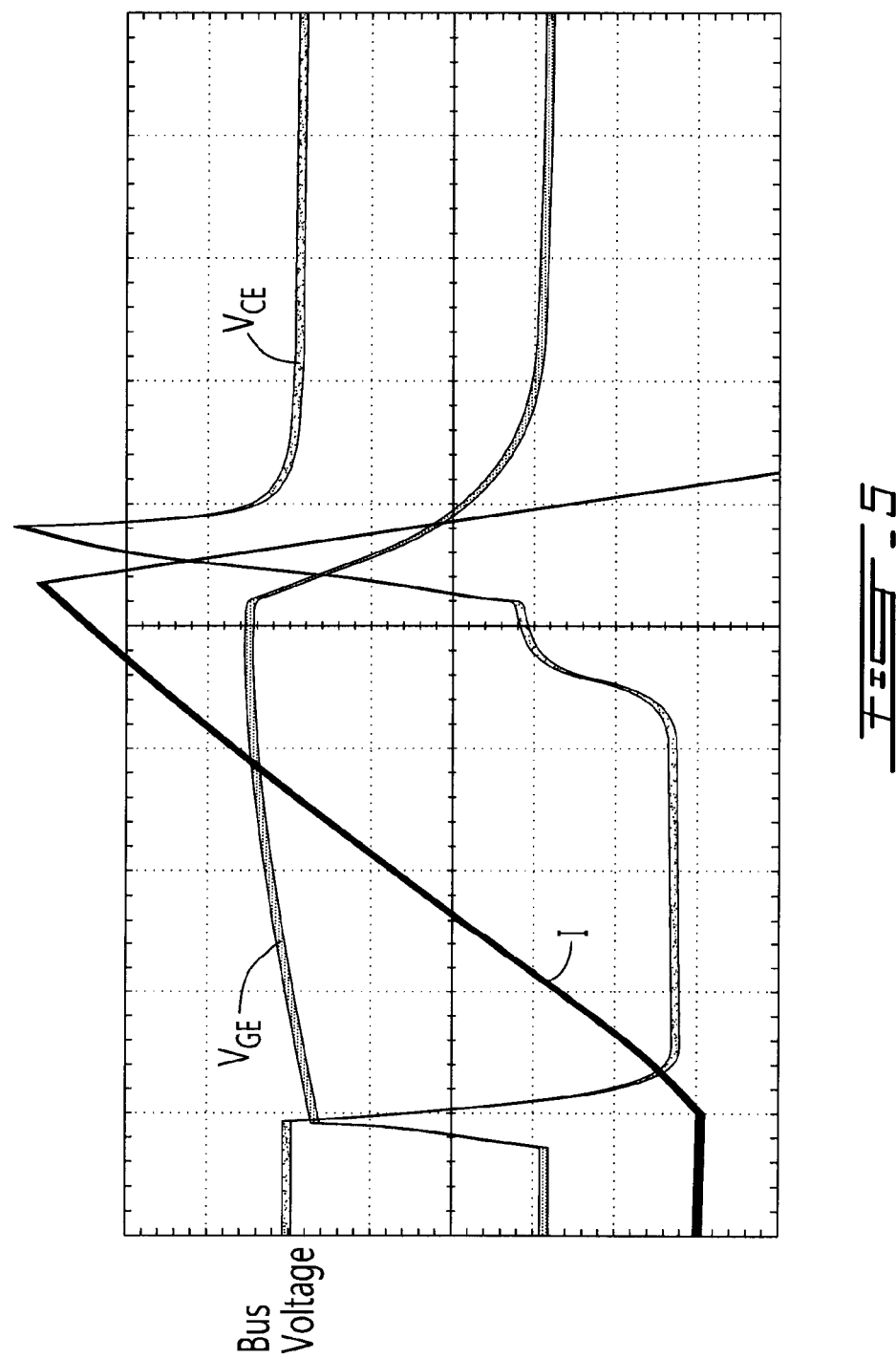
FIG. 5 is a diagram showing current and voltage waveforms at turn-off of the IGBTs of FIG. 4.

Generally stated, by changing the reference of the gate driver from the emitter (logical pin) of FIG. 4 to the ground bus (for the bottom IGBT $Q_1$) and to the collector of the bottom IGBT (for the top IGBT $Q_2$), it is possible to decrease this overvoltage of $V_{ce}$ during turn-off.

In other words, a technique for connecting reference of the gate driver to a power tab of the IGBT, the power tab being itself connected to a power source, instead of to the logical pin has been developed. A voltage across the emitter inductance is injected in the gate driver to create a negative voltage at the emitter of the IGBT to slow down the negative slope of $V_{ge}$, as will be discussed hereinbelow. The result is a direct action on the gate voltage without any delay and di/dt limitations.

Figure 6:
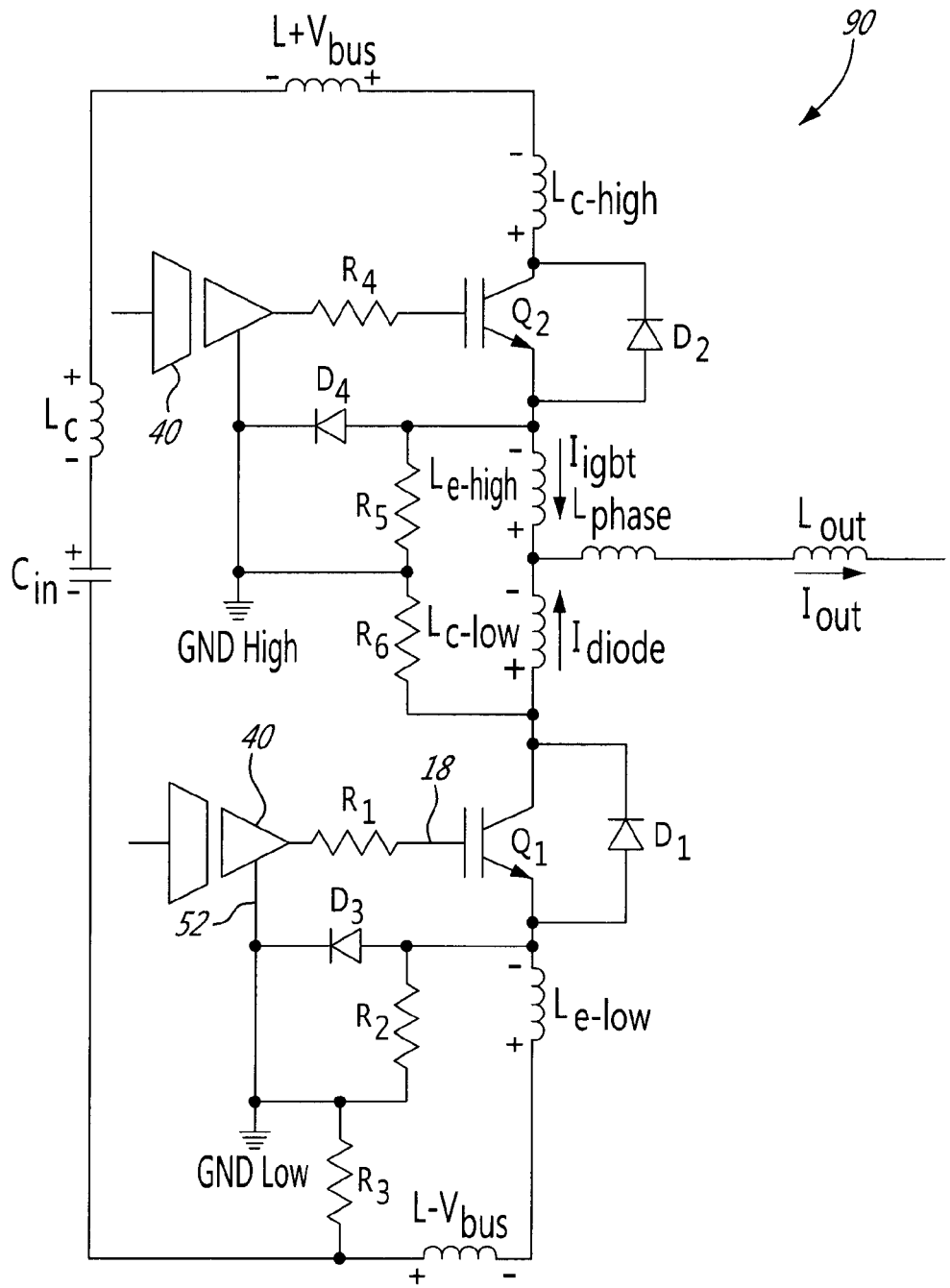
FIG. 6 is a circuit diagram of an IGBT leg having resistive dividers connected across stray emitter inductances, according to an embodiment.

Because there is no optimal emitter inductance between the logical and power connections of the emitter in a commercial IGBT module, the present disclosure introduces a technique developed to optimize the sample of the overvoltage injected in the gate drive circuit using a resistive divider. FIG. 6 is a circuit diagram of an IGBT leg having resistive dividers connected across stray emitter inductances, according to an embodiment. Generally, FIG. 6 shows an IGBT leg 90 including compensation circuits connected to gate drivers 40 in a configuration that reduces overvoltage on the IGBTs. FIG. 6 introduces a compensation circuit that optimizes overvoltage on the IGBT using a resistive divider.

Discussing the bottom portion of the IGBT leg 90 of FIG. 6, the bottom IGBT $Q_1$ includes has a parasitic collector inductance $L_{c-low}$, a parasitic emitter inductance $L_{e-low}$. The gate of the bottom IGBT $Q_1$ connected to its gate driver 40 via a resistor $R_1$. A reference 52 of the gate driver 40 is connected to a compensation circuit having a resistive divider circuit including two resistors $R_2$ and $R_3$ and a diode $D_3$ that allows the turn-on not to be impacted by shorting the resistor $R_2$ when a voltage at the emitter of the bottom IGBT $Q_1$ is higher than the reference 52.

Figure 7:
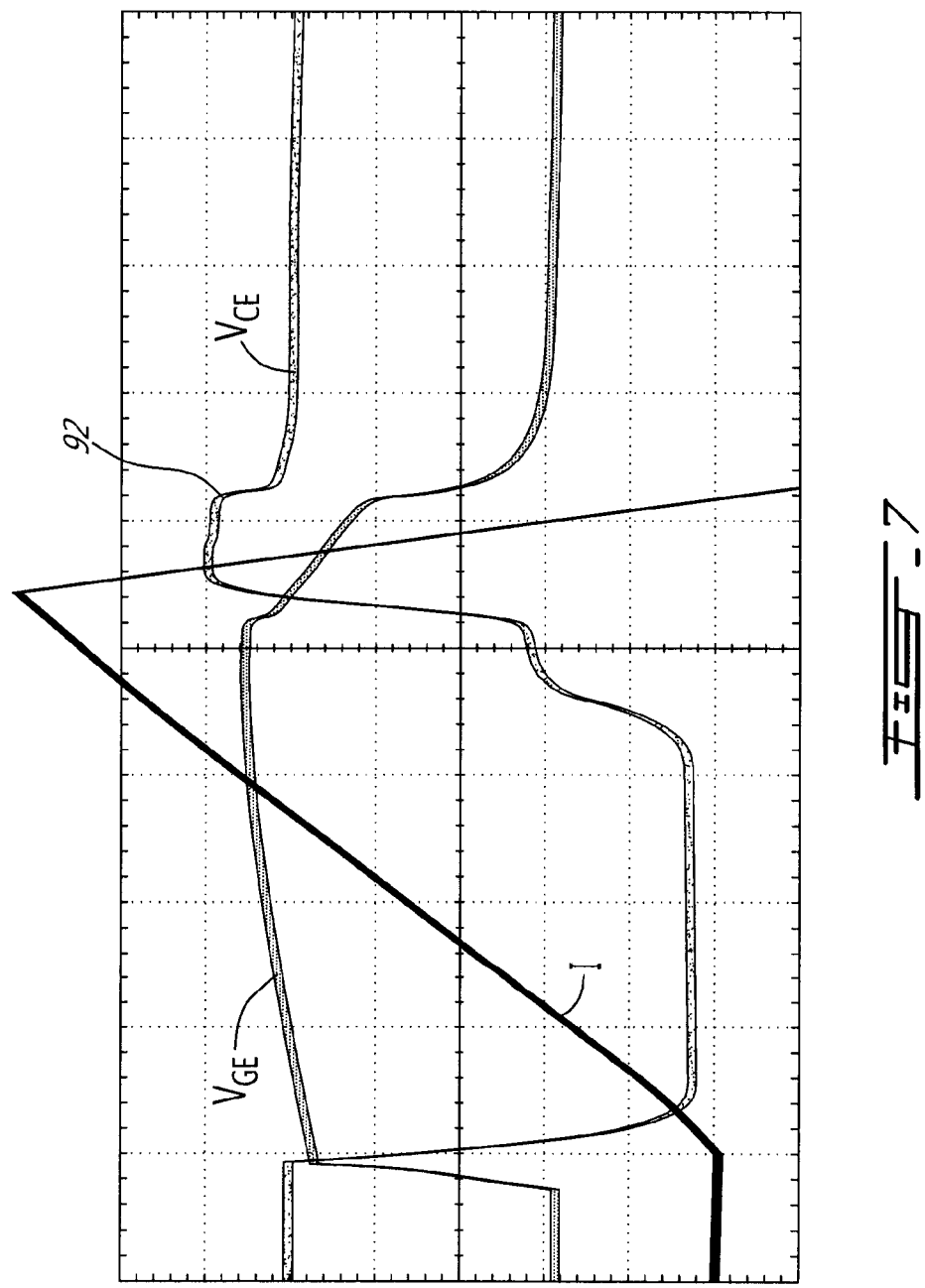
FIG. 7 is a diagram showing current and voltage waveforms at turn-off of the IGBTs of FIG. 6 with a bus voltage of 500 volts.

In the circuit of FIG. 6, values of the resistors $R_2$ and $R_3$ are selected according to an acceptable overvoltage level allowed across the bottom IGBT $Q_1$. FIG. 7 is a diagram showing current and voltage waveforms at turn-off of the IGBTs of FIG. 6 with a bus voltage of 500 volts. FIG. 8 is a diagram showing current and voltage waveforms at turn-off of the IGBTs of FIG. 6, the resistive divider being adjusted for a maximum bus voltage of 300 volts in short circuit condition. A ratio of $R_2$ over $R_3$ is increased to reduce the overvoltage. The value of these two resistors $R_2$ and $R_3$ in parallel is set, in series with a gate driver resistor $R_1$. A value of the gate driver resistor $R_1$ is adjusted in a conventional manner according to a proper commutation behavior.

By correctly setting values of the resistors of the compensation circuits, it is possible to reduce the effect of the emitter inductance to get the maximum overvoltage allowed to therefore improve the efficiency.

In other words, the normal practice consisting in using a resistor $R_1$ in the ground connection of the gate driver to limit the current in the diodes that protect the gate driver of the lower IGBT from a negative voltage when the upper IGBT turns off has been modified by splitting the resistor in two resistors, including $R_1$ in series with $R_2$ and $R_3$ connected in parallel, and by adapting their ratio to limit the effect of the emitter inductance on the di/dt. An equivalent resistor value may remain the same, but the voltage divider gives the desired weight of the emitter inductance to limit the overvoltage at the desired level.

The overvoltage can be optimized as much as possible to reach the maximum IGBT rating. This is done by reducing a value of $R_2$, the resistor connected to the IGBT emitter, compared to $R_3$, the resistor connected to the power tab. The voltage across the emitter inductance will be split in two and only the voltage across the logical resistor will be applied in the gate drive circuit to limit the gate voltage drop.

FIGS. 7 and 8 both show the current I and the voltages $V_{ge}$ and $V_{ce}$ during turn-off for the circuit of FIG. 6, for different bus voltages. It may be observed that overvoltage of $V_{ce}$ during turn-off is greatly reduced (see plateau 24). This plateau 24 occurs while a drop rate of the voltage $V_{ge}$ is reduced by the insertion of a sample of the voltage across the parasitic inductance $L_{e\text{-}low}$.

The duration of the plateau 92 impacts losses of the commutation cell during turn-off of the IGBT. A longer plateau 92 brings higher losses. Because of the desire to limit at the same time the overvoltage and its length, a square wave shape of the overvoltage plateau 92 is suitable. The intrinsic behavior (natural feedback) of the overvoltage gives this shape.

This technique works very well for the bottom IGBT $Q_1$ because the emitter inductance $L_{e\text{-}low}$ is sufficiently large to provide good overvoltage sampling. In contrast, for the top IGBT $Q_2$, the emitter inductance $L_{e\text{-}high}$ often has a too small value to suitably clamp a voltage thereacross without increasing the gate resistor $R_3$, to protect the top IGBT $Q_2$. In practice, the emitter inductance $L_{e\text{-}high}$ of the top IGBT $Q_2$ is very often too low to be used to bring down the overvoltage across the top IGBT $Q_2$ to a safe level.

Indeed, because of the constraints on packaging of IGBT modules, the upper and lower semiconductors are packaged within close proximity of each other so the inductance of the upper IGBT $Q_2$, $L_{e\text{-}high}$, is quite small, in the order of a few nH. On the other hand, because the only point of connection other than the logical emitter of the lower IGBT $Q_1$ is the power tab of $-V_{bus}$, the inductance of the lower IGBT $Q_1$, $L_{e\text{-}low}$, may be as much as 5 times the upper emitter inductance $L_{e\text{-}high}$. The connection of the $-V_{bus}$ tab is highly inductive because of its length and curves.

In other words, IGBT modules have two power connections, part of the high-frequency loop, that are the most inductive, including a $+V_{bus}$ tab and a $-V_{bus}$ tab. Because the $-V_{bus}$ tab is in the path of the emitter of the bottom IGBT $Q_1$, it can be used in the manner described hereinabove to inject a sample of the overvoltage across the IGBT $Q_1$ in the gate driver of the bottom IGBT $Q_1$. However, since the $+V_{bus}$ tab is connected to the collector of the top IGBT $Q_2$, this inductance cannot be used directly as a feedback in the gate driver.

To use the $L_{e\text{-}high}$ inductance as a source of feedback in the gate driver of the top IGBT $Q_2$, there is a need to somehow increase its apparent inductance without unduly increasing the overall inductance of the high frequency loop. Two possible techniques to increase the $L_{e\text{-}high}$ inductance will be described hereinbelow.

In order to optimize the top IGBT $Q_2$ turn-off, a first technique using the collector parasitic inductance to inject a sample of the overvoltage across the top IGBT $Q_2$ using a transformer to isolate the collector from the emitter has been designed. This technique is illustrated in FIG. 9, which is a circuit diagram of an IGBT leg using a transformer to increase an apparent emitter inductance, according to another embodiment. The transformer is used to reduce overvoltage on the top IGBT $Q_2$. A primary $T_{1a}$ of the transformer is connected across the parasitic inductance $L_{c\text{-}high}$ of the top IGBT $Q_2$. A secondary $T_{1a}$ of the transformer is connected in series with a resistor $R_5$, which is connected further to a ground reference to a gate driver of the top IGBT $Q_2$. The primary $T_{1a}$ and the secondary $T_{1a}$ are connected so that when a current $I_{igbt}$ flowing through the top IGBT $Q_2$ is decreasing at turn-off, a voltage having a polarity as shown on FIG. 9 is generated across both the parasitic inductance $L_{c\text{-}high}$ and the primary $T_{1a}$. The transformer causes a voltage having another polarity as shown on FIG. 9 to be generated across the primary $T_{1b}$.

Therefore, a negative voltage that appears across the transformer when the current decrease in the top IGBT $Q_2$ is used to cause a negative voltage applied at the emitter of the top IGBT $Q_2$ to slow down the slope of its gate voltage. Control of the overvoltage for the top IGBT $Q_2$ can thus be performed by properly selecting a turn ratio of the transformer.

It may be observed that the operating principle of the circuit of FIG. 9 is quite similar to that of the circuit of FIG. 6. The parasitic inductance $L_{e\text{-}high}$ of the emitter of the top IGBT $Q_2$ not being sufficient to properly slow down the negative $V_{ce}$ slope of at turn-off the top IGBT $Q_2$ using the technique of FIG. 6, a sample of the parasitic inductance $L_{c\text{-}high}$ of the collector of the top IGBT $Q_2$ is placed in series with parasitic inductance $L_{e\text{-}high}$ through the transformer.

Figure 10:
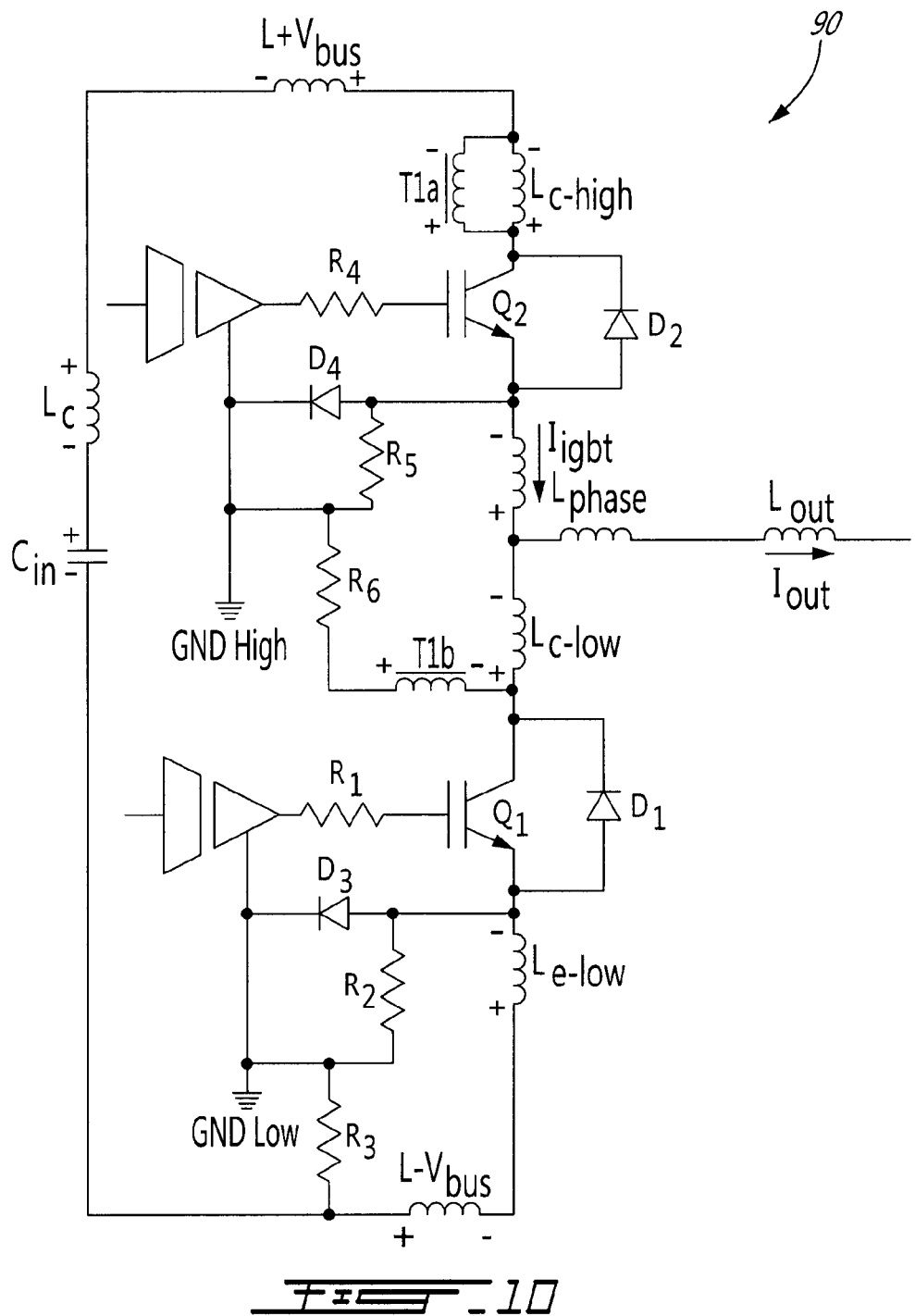
FIG. 10 is a variant of the circuit diagram of FIG. 9 using a transformer and a resistive device, according to a further embodiment.

FIG. 10 is a variant of the circuit diagram of FIG. 9 using a transformer and a resistive device, according to a further embodiment. In this variant, reduction of the overvoltage on the top IGBT $Q_2$ is made by using the transformer in addition to a resistive divider. The resistive divider includes resistors $R_5$ and $R_6$ connected in a manner similar to resistors $R_2$ and $R_3$ used to control overvoltage of the bottom IGBT $Q_1$. Otherwise stated, FIG. 10 combines the features of FIGS. 6 and 9 to enable fine tuning of the shape of the negative slope of the $V_{ge}$ on the top IGBT $Q_2$.

A further technique to increase the emitter inductance of the top IGBT $Q_2$ will now be described in FIGS. 11 and 12, which are schematic layouts for IGBT legs having connectors for adjusting top emitter inductances according to first and second variants. These layouts may be used to build three (3) IGBT legs as illustrated in FIG. 6, forming a power converter, or inverter, providing three-phase AC current to a load. As will be explained hereinbelow, the parasitic inductance $L_{e\text{-}high}$ is made adjustable by configuration of the connectors.

Increasing the parasitic inductance of the top IGBTs $Q_2$ may have an impact on the inductance of the total high frequency loop of the IGBT legs. However, impacts of this parasitic inductance on the control of the overvoltage are much more significant. FIG. 11 is a schematic layout for an IGBT leg 90 having a connector for adjusting a top emitter inductance according to a first variant. On FIG. 11, three (3) top IGBTs $Q_2$ are mounted on areas 102 and three (3) bottom IGBTs $Q_1$ are mounted on areas 112. Each top IGBTs $Q_2$ has a collector mounted to a trace 104, identified on FIG. 11 as C-High. Emitters of the top IGBTs $Q_2$ are connected to emitter pads 106 via wire bonds 110. Similarly, each bottom IGBT $Q_1$ has a collector mounted to a trace 114 identified on FIG. 11 as C-Low. Emitters of the bottom IGBTs $Q_1$ are connected to a trace 118 via wire bonds 120, the trace 118 being referred to as E-Low. The trace 114 also has collector pads 116 that are connected thereto.

A $+V_{bus}$ tab 122 is connected to trace 104 while A $-V_{bus}$ tab 124 is connected to trace 118. A phase tab 126 for connecting a load to the power converter is connected to trace 114. The gates of the IGBTs mounted on areas 102 and 112 are not shown in FIG. 11 in order to simplify the illustration.

The pads 106 and 116 are interconnected by a U-shaped connector 128 having six (6) legs 130 so configured, sized and positioned as to connect to the pads 106 and 116. The U-shaped connector 128 defines at least in part the parasitic inductance $L_{e\text{-}high}$ since it interconnects emitters of the top IGBTs $Q_2$ and collectors of the bottom IGBTs $Q_1$. Since the U-shape connector 128 is relatively large and includes right angles, the $L_{e\text{-}high}$ inductance is relatively high and can be used to limit the overvoltage in the top IGBTs $Q_2$ as discussed hereinabove. The size and shape of the connector 128 may be determined according to the desired parasitic inductance required.

Figure 11:
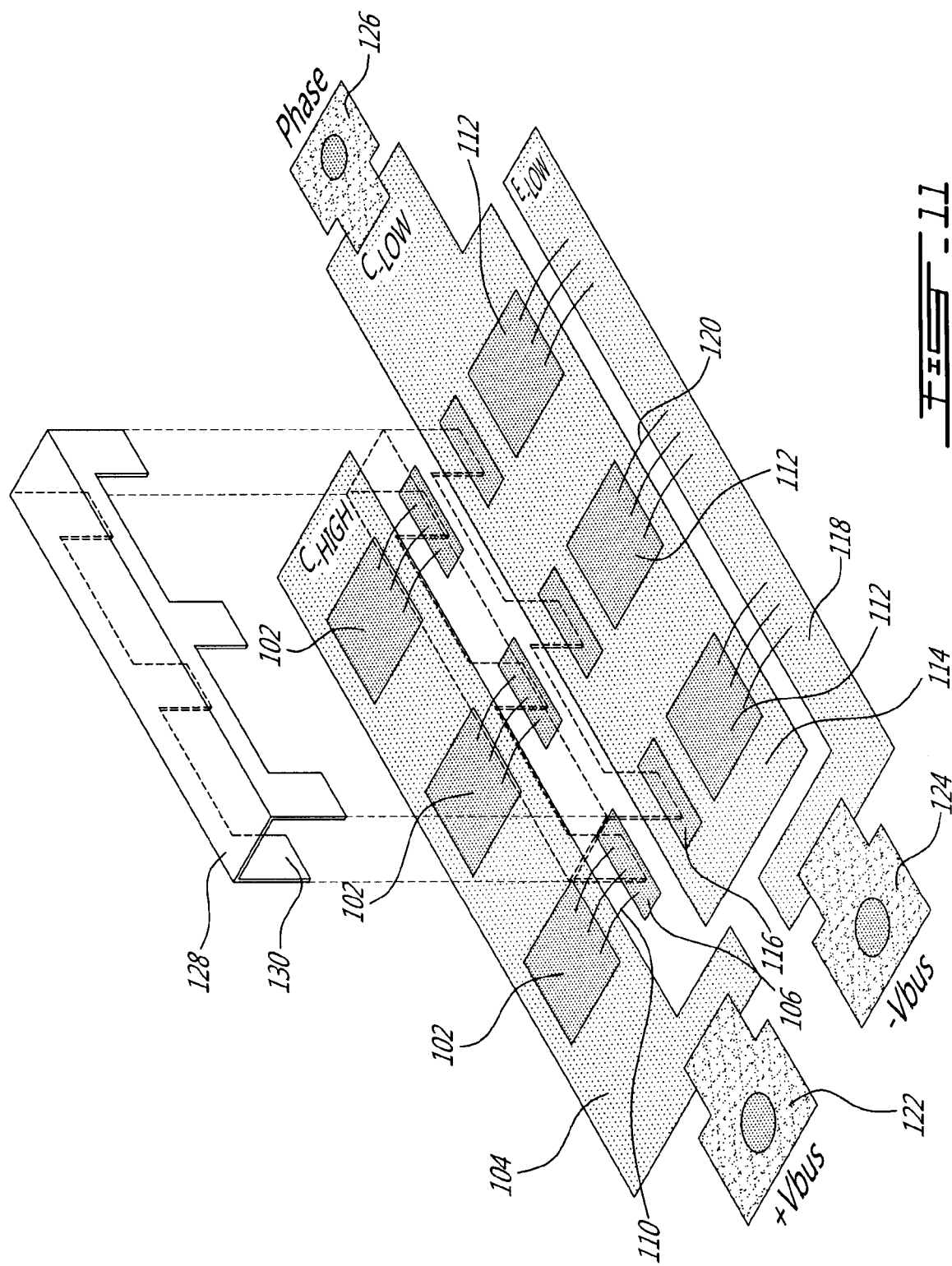
FIG. 11 is a schematic layout for an IGBT leg having a connector for adjusting a top emitter inductance according to a first variant.
Figure 12:
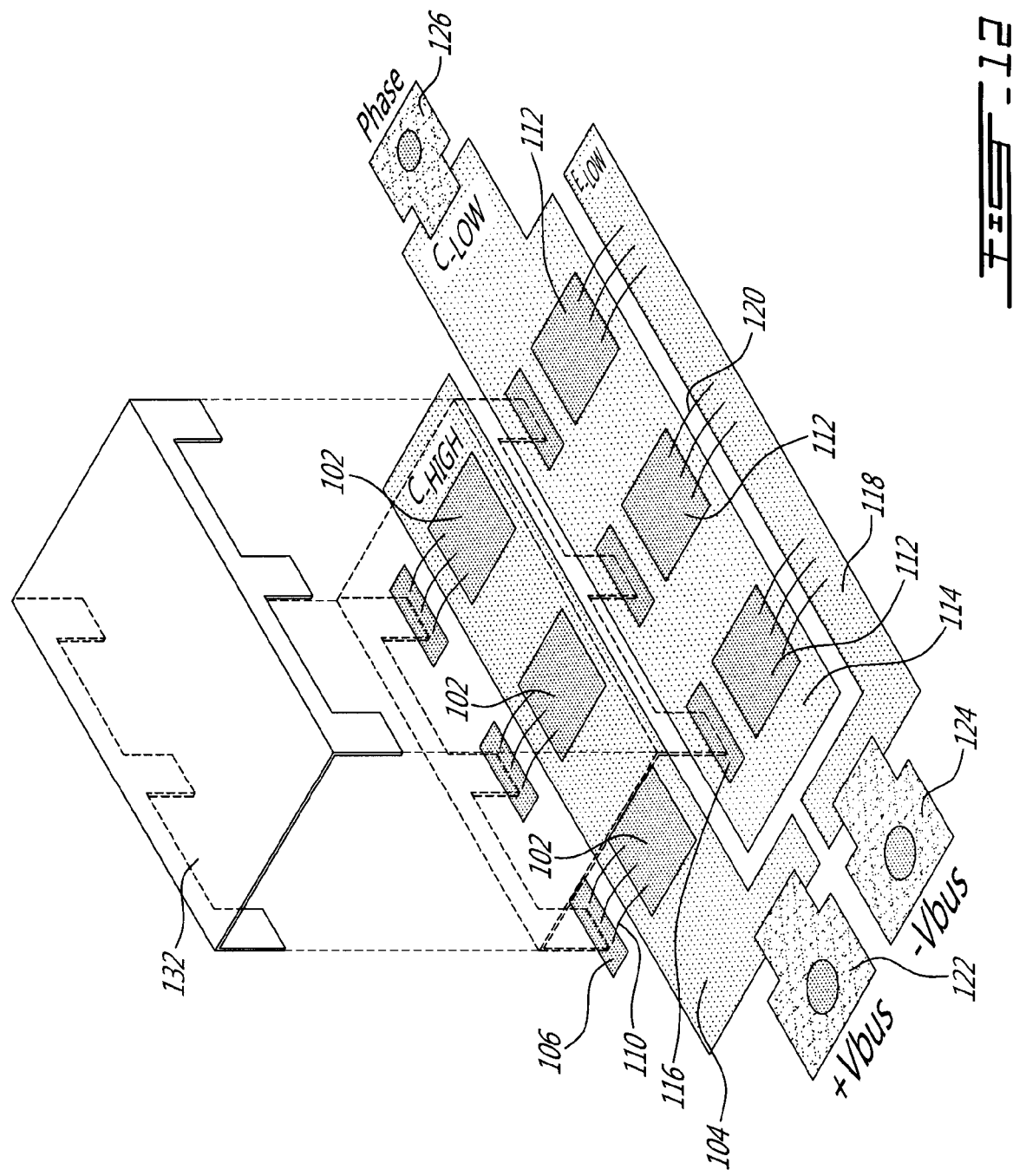
FIG. 12 is a schematic layout for an IGBT leg having a connector for adjusting a top emitter inductance according to a second variant.

Turning now to FIG. 12, which is a schematic layout for an IGBT leg having a connector for adjusting a top emitter inductance according to a second variant, a main difference between the shown layout and the layout of FIG. 11 and the layout of FIG. 12 lies in the position of the pads 106. On FIG. 12, the pads 106 are positioned farther away from the pads 116 to provide added space for a larger connector 132. The larger connector 132 of FIG. 12 confers a larger parasitic inductance $L_{e\text{-}high}$ to the layout of FIG. 12.

It is desired to reducing switching losses at turn-on of a power electronic switch. Even if the turn-on overvoltage across one IGBT is not as high the overvoltage across the opposite IGBT at turn-off, there is a limit above which a parasitic capacitance $C_{CG}$ between the collector and the gate (called a Miller capacitance) of the IGBT being turned on will inject enough current in its gate to turn it on and create a cross conduction.

FIG. 13 is a schematic representation of IGBT capacitances including a Miller Capacitance. A Miller current 200 circulates in the Miller capacitance $C_{CG}$, causing a voltage variation dv/dt thereacross. The Miller current 200 is split between a portion 202 flowing through a gate resistance $R_{Goff}$ and a portion 204 flowing through a gate to emitter parasitic capacitance $C_{GE}$. The gate driver tries to maintain the gate to emitter voltage $V_{ge}$ in an off state, sinking the current 202 with the gate resistor $R_{Goff}$. To this end, the gate resistor $R_{Goff}$ has a low value to keep the gate to emitter voltage $V_{ge}$ below the threshold voltage $V_{get(h)}$ even in the presence of the Miller current.

Previously described FIG. 10 shows the current $I_{igbt}$ flowing through the top IGBT $Q_2$. In another phase, the top IGBT $Q_2$ turns off and a similar current flows through bottom IGBT $Q_1$. These current has negative di/dt at turn-off of the respective IGBTs. The polarity of the voltages generated across the two emitter inductances $L_{e\text{-}high}$ and $L_{e\text{-}low}$, upon turn-off of the respective IGBT, and across the primary $T_{1a}$ of the transformer in the case of the top IGBT $Q_2$, tend to maintain the IGBTs on during their turn-off process. These voltages slow down the variation of the gate to emitter voltage $V_{ge}$ of the IGBTs being turned off but also tend to turn on the opposite IGBT. This has limited impact because it happens while current has started to circulate in the freewheel diodes. The voltage across the IGBT mounted in parallel to the freewheel diode having become conductive is zero. When one IGBT turns on, the voltage across its emitter inductance is also opposite to the gate signal so the net effect is a tendency to keep the IGBT turned off. The present technology increases the immunity of the dv/dt of the $V_{ce}$ to keep one IGBT off during the turn-on process of the opposite IGBT by applying a negative voltage at the emitter of the IGBT being turned off. This technology minimizes the risks of cross-conduction.

The present technology allows the use of turn-off gate resistors having significantly reduced values. This improves efficiency of the IGBT leg. Instead of using a large gate resistance value, control of the di/dt relies on sampling the voltage across the emitter inductance. It is then possible to accelerate further the turn-on of the IGBT, up to the point where the Miller current circulating in the small turn-off resistor no longer generates a gate to emitter voltage $V_{ge}$ across of the IGBT meeting the threshold voltage $V_{get(h)}$.

Furthermore, while one IGBT is being turned on, the voltage present at the emitter of the opposite IGBT is high. A large voltage would need to be applied at the gate of that opposite IGBT in order for the gate to emitter voltage $V_{ge}$ of the opposite IGBT to exceed the $V_{get(h)}$.

FIG. 14 is an illustration of an equivalent circuit of a typical IGBT. An IGBT 220 combines, in a single device, the simple and low power capacitive gate-source characteristics of metal-oxide-semiconductor field-effect transistors (MOSFET) with high-current and low-saturation-voltage capability of bipolar transistors. The IGBT 220 can be used as the power electronic switch 18 of FIGS. 1 and 2 and can be used as the top and bottom IGBTs $Q_1$ and $Q_2$ of the IGBT legs 70 and 90. The IGBT 220 has a gate 226, a collector 222 and an emitter 224. In more details, the equivalent circuit of the IGBT 220 is made from one MOSFET 230 and two bipolar transistors 232, 234 connected in a thyristor configuration 236, the equivalent circuit of the thyristor being the same as the output stage of the IGBT 220: two bipolar transistors, including one PNP transistor 232 and one NPN transistor 234 that polarize each other. The input of the IGBT 220 is made from an equivalent MOSFET 230 that is voltage-controlled, has low-power gate driver dissipation and provides high speed switching. The output of the IGBT 220 is made with the two bipolar transistors 232, 234 connected in the thyristor configuration 236 to provide a powerful output.

While the bipolar transistors 232, 234 are capable of supporting high power levels, their reaction time does not match that of the MOSFET 230.

When the IGBT 220 is subjected to a sufficient gate to emitter voltage Vge, the MOSFET 230 turns on first. This causes current to circulate through the base-emitter junction of the PNP transistor 232, turning the PNP transistor 232 on. This, in turn, turns on the NPN transistor 234, following which the IGBT 220 is ready to deliver high-level current through the collector 222 and the emitter 224.

The MOSFET 230 can take the whole current of the IGBT 220 under light loads, via the drift region resistor 240, which implies that the IGBT 220 is capable of turning on quickly with a well-controlled variation di/dt of the current flowing through the collector 222 and the emitter 224. To carry the current at full rating of the IGBT 220 under heavier loads, the bipolar transistors 232, 234 need to turn on. Speed of the full turn-on of the IGBT 220 depends on the temperature and on the amplitude of the current flowing through the collector 222 and the emitter 224.

The MOSFET 230 also switches first at turn-off of the IGBT 220. Even when the MOSFET 230 is completely off, the two bipolar transistors 232, 234 remain conductive until minority carriers located on their base-emitter junctions are removed. The body region resistor 242 of the IGBT 220 allows the thyristor 236 to turn off by turning the NPN transistor 234 off first. Once the NPN transistor 234 is off, the minority carriers of the base-emitter junction of the PNP transistor 232 are removed, effectively terminating the turn-off process of the IGBT 220.

Because the output stage of the IGBT 220 formed by the bipolar transistors 232, 234 is slower than its input stage formed by the MOSFET 230, there is a limit above which speeding up a control signal applied at the gate 226 will have no significant impact on the switching time of the IGBT 220. For example, at turn-on, at a greater current load than can be handled by the MOSFET 230, the full current load can only be supported once the thyristor 236 (i.e. the two bipolar transistors 232, 234) is turned on. In the same way, at turn-off, even when accelerating a control signal applied at the gate 226, the thyristor 236 remains conductive until the minority carriers are removed.

The inherent non-linearity of the various components of the IGBT 220 complicates its control and makes it difficult to operate with maximal efficiency. While it is desired to rapidly switch the IGBT 220 on and off in order to reduce as much as possible losses during the commutation process, it is also desired to avoid excessive collector to emitter overvoltage of the IGBT 220 while also avoiding excessive recovery current of a freewheel diode, such as 16, $D_1$ or $D_2$, operating in tandem with the IGBT 220.

With present gate driver technology, the limit of the turn-on speed is redefined by the fact that the Miller Capacitance is no longer a limiting factor. Like thyristors, IGBTs may latch up and stay on. With a very high dv/dt across the collector-base junction of the bipolar transistors 232 and 234, a large current in the body region resistor 242 may polarize the NPN transistor 234. When this occurs, the latch-up takes place and both transistors 232 and 234 polarize each other. Though this effect is minimized in current IGBT technology, it is recommended to limit di/dt within a safe range, above which proper functionality of the IGBT cannot be guaranteed.

Figure 15:
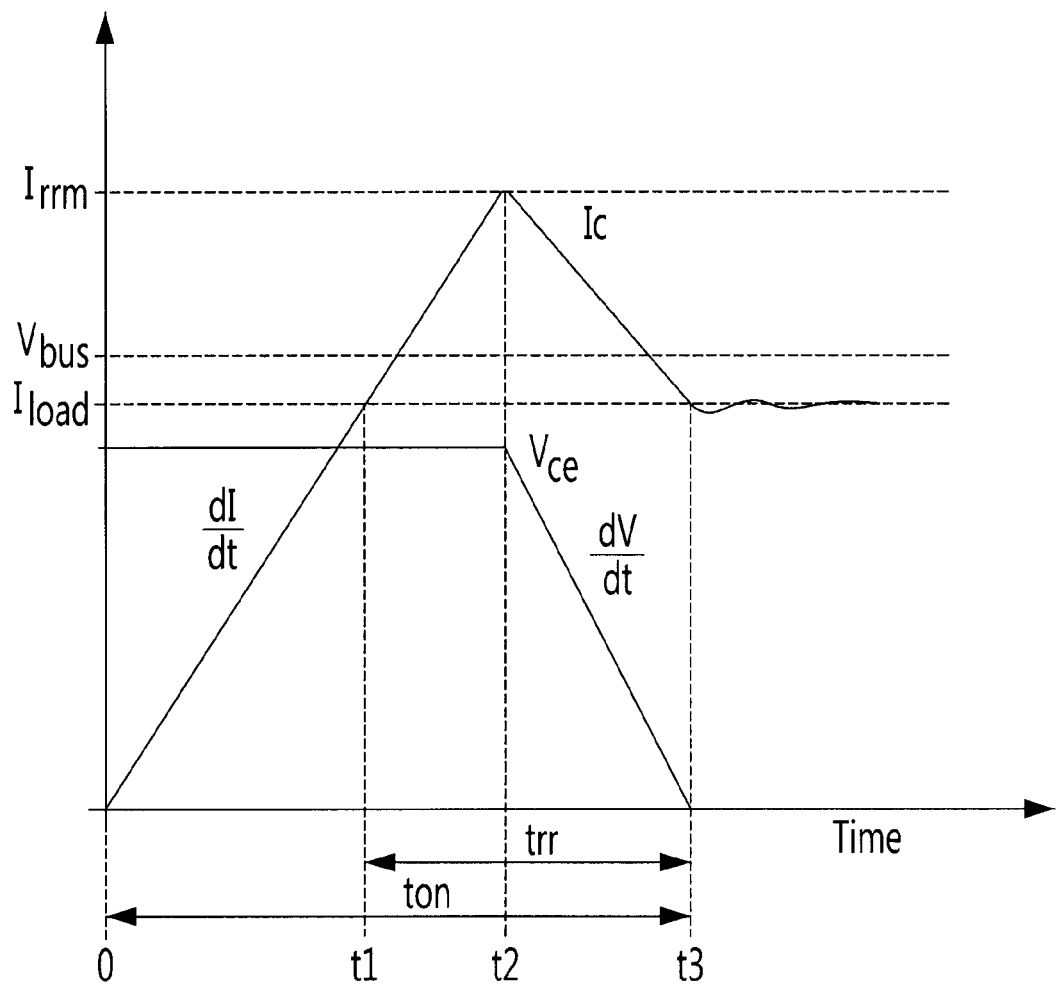
FIG. 15 is a graph showing wave shapes of the current through a IGBT and a collector to emitter voltage of the IGBT.

FIG. 15 is a graph showing wave shapes of the current through an IGBT and a collector to emitter voltage of the IGBT. Once the current in the IGBT reaches the output current, at $t_1$, the current starts to circulate in the reverse direction in the opposite freewheel diode. The freewheel diode turns off when the charges accumulated on its P-N junction are removed, at $t_2$. This is the first part of the recovery current. The second part is the drop (negative dv/dt) of the voltage across the IGBT, from $t_2$ to $t_3$.

The difference between the IGBT voltage and the bus voltage is the voltage induced across $L_{stray}$*di/dt during the first part. The integral of $L_{stray}$*di/dt from $t_1$ until $t_2$ represents the charges that need to be removed. If the di/dt is high, the time taken to remove the charge will be short while the peak current will be high. By definition, losses Eon during turn-on are as per equation (2):

$$Eon = \int_{ton} v(t) * i(t) * dt \qquad (2)$$

The current circulating in the stray inductance of the high frequency loop cannot stop instantaneously. It is instead deviated to the emitter-collector parasitic capacitance of the IGBT and creates a dv/dt according to the maximum recovery current. In other words, a high di/dt engenders a high peak recovery current that in turn creates a high dv/dt across the collector-emitter junction of the IGBT.

In order to reach the lowest possible losses at turn-on of the IGBT, it is desired to reduce the switching time as much as possible while limiting the di/dt at the time the diode turns off.

The present technology controls the di/dt at IGBT turn-off as explained above. The following passages express how this technology can be transpose to the turn-on of the IGBT. The present technology reduces the di/dt below the limit recommended by the supplier of the IGBT. As mentioned hereinabove, this limit should be applied when a freewheel diode turns off upon turn-on of the corresponding IGBT.

Figure 16:
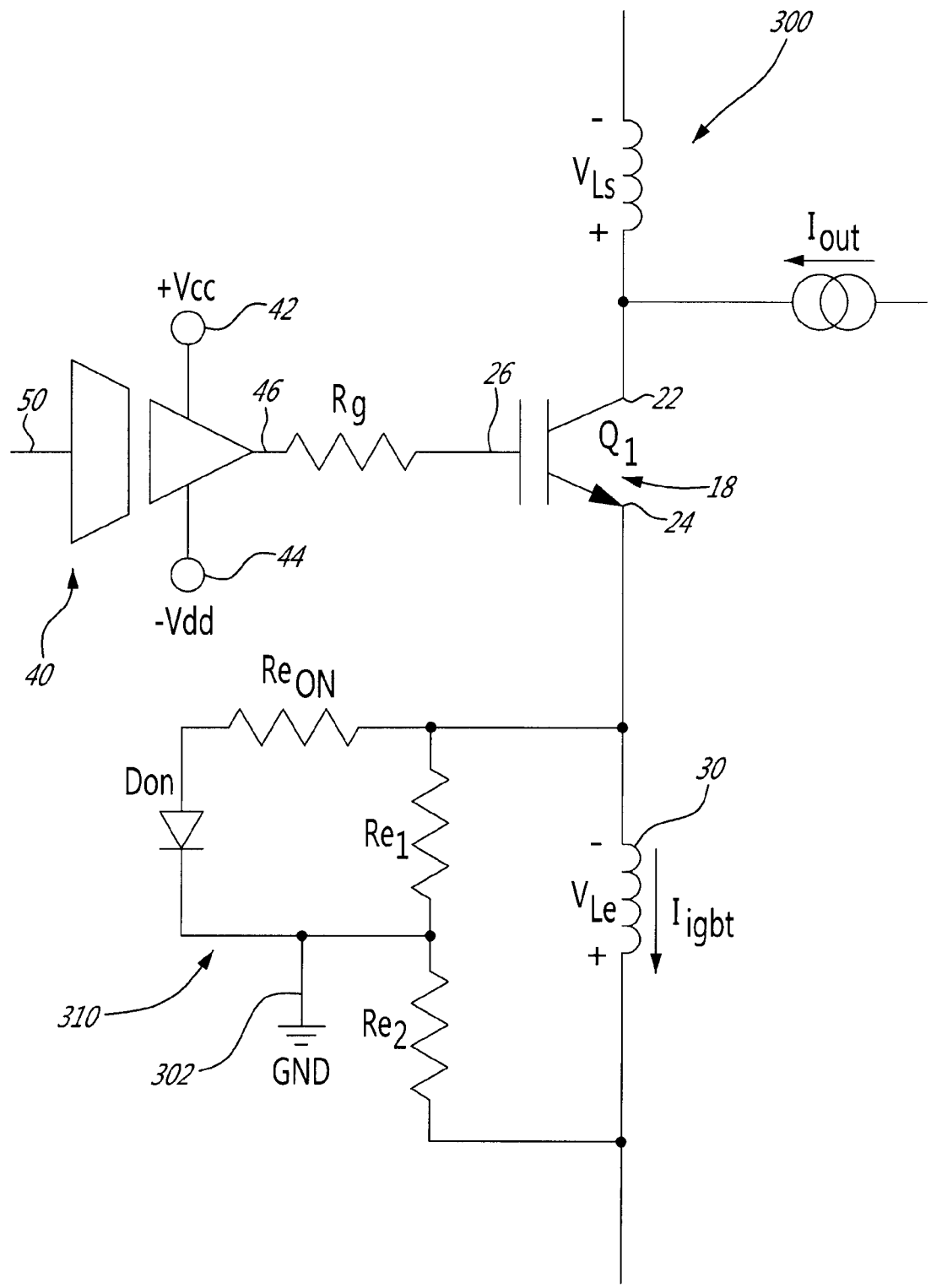
FIG. 16 is a diagram of a commutation cell having a circuit for limiting overvoltage at turn-off of the power electronic switch and recovery current at turn-on of the power electronic switch, when the freewheel diode turns-off, according to an illustrative embodiment.

FIG. 16 is a diagram of a commutation cell having a circuit for limiting overvoltage at turn-off of the power electronic switch and recovery current at turn-on of the power electronic switch, when the freewheel diode turns-off, according to an illustrative embodiment. A commutation cell 300 is modified in comparison with the commutation cell 10 described hereinabove by the addition of a compensation circuit 310 in parallel with the emitter inductance 30. FIG. 16 also shows a ground reference 302, the positive supply voltage 42 and the negative supply voltage 44 of the gate driver 40 introduced hereinbefore being defined relative to the ground reference 302.

The compensation circuit 310 comprises three (3) resistors and a turn-on diode. Resistors $R_{e1}$ and $R_{e2}$ form a gain adaptor operative to control a voltage $V_{ge}$ on the gate and emitter of the power electronic switch 18 when the power electronic switch 18 is being turned off, thereby limiting overshoot of a voltage $V_{ce}$ between the collector 22 and emitter 24. A third resistor $R_{eON}$ and a turn-on diode $D_{on}$, that only allows the current to circulate at turn-on, do not impact the gain adaptor upon turning off of the power electronic switch 18, for reasons expressed hereinbelow.

When turning off the power electronic switch 18, the output 46 of the gate driver 40 is set to $-V_{dd}$ and, rapidly, the voltage at the gate also reaches $-V_{dd}$. Because the power electronic switch 18 is now turning off, the IGBT current reduces rapidly, leading to a negative value of its derivative di/dt. This creates voltages $V_{Ls}$ and $V_{Le}$ with polarities as shown on FIG. 16, a sum $V_{Ls}$ and $V_{Le}$ forming a total overvoltage in the high-frequency loop inductance 34, including the emitter inductance 30. The voltage at the emitter 24 becomes lower than the ground reference 302. The turn-on diode $D_{on}$ is reversed polarized and forms an open-circuit; the compensation circuit 310 thus acts as if the resistor $R_{eON}$ was not present at turn-off of the power electronic switch 18.

Continuing with the turn-off situation, a voltage across the resistor $R_{e1}$ is equal to $V_{Le}$ times a gain G equal to $R_{e1}/(R_{e1}+R_{e2})$. Because the gate driver has the same ground reference 302, the voltage $V_{ge}$ between the gate 26 and the emitter 24 becomes equal to the voltage across the resistor $R_{e1}$, with the added contribution from the negative supply voltage 44, i.e. $-V_{dd}$. Otherwise stated, a feedback from $V_{Le}$ is applied between the gate 26 and the emitter 24, with the gain G as expressed hereinabove.

The gain adaptor is not limited to using resistors as shown on FIG. 16 and any other manner of providing a voltage gain based on the voltage $V_{Le}$ are also contemplated.

Figure 17:
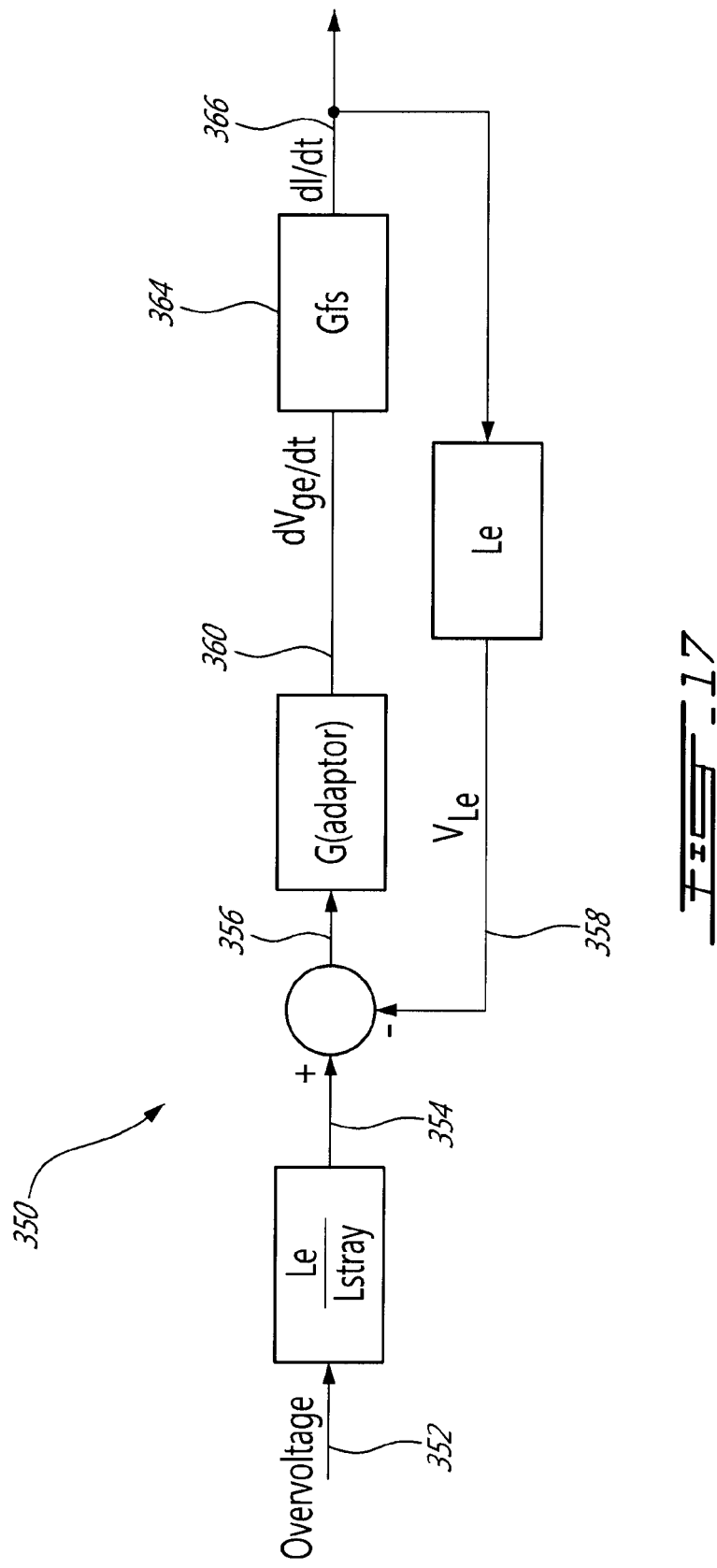
FIG. 17 is a small signal control loop model of the commutation cell of FIG. 16 at turn-off of the power electronic switch.

The above will be best understood considering FIG. 17, which is a small signal control loop model of the commutation cell of FIG. 16 at turn-off of the power electronic switch. A model 350 defines an overvoltage set-point 352, defined according to characteristics of the power electronic switch 18 and the bus voltage. The overvoltage set-point 352 is selected in order not to harm the power electronic switch 18 upon turn-off. A factor calculated from a value $L_e$ of the emitter inductance 30 over a value $L_{stray}$, representing a total parasitic inductance of the high-frequency loop 36, provides a set-point 354 for a desired maximum voltage about the emitter inductance 30. A difference 356 (near zero volt) between the set-point 354 and the actual value 358 of $V_{Le}$ is multiplied by a gain G of the adaptor, the gain G having the value $R_{e1}/(R_{e1}+R_{e2})$ (in the illustrated embodiment), providing a small signal voltage 360 across the resistor $R_{e1}$ and across the gate 26 and emitter 24 of the power electronic switch 18. This voltage varies over time as the current causing the voltage 358 also varies. This voltage variation is expressed as $dV_{ge}/dt$. Given a transconductance 364 of the power electronic switch 18, having a value $G_{fs}=di/dV_{ge}$, a variation of current 366

$$\left(\frac{di}{dV_{ge}} \cdot \frac{dV_{ge}}{dt} = \frac{di}{dt}\right)$$

is obtained. The actual value 358 of $V_{Le}$ is equal to the value $L_e$ of the emitter inductance 30 times the variation of current 366 (di/dt).

Proper selection of the gain G, by selection of values $R_{e1}$ and $R_{e2}$, as a function of known, measured or expected values of the inductances 30 and 34, allows limiting the actual value 358 of $V_{Le}$ within the set-point 354 and, at the same time, the overall overvoltage within the set-point 352.

Returning to FIG. 16, at turn-on of the power electronic switch 18, current flowing therethrough increases rapidly and the current variation di/dt takes a positive value. It is desired to limit the di/dt when the freewheel diode 16 turns-off to reduce the recovery current flowing through the freewheel diode 16 in reverse direction. It is well known that the recovery current of the freewheel diode 16 increases with the reverse di/dt when blocking. Furthermore, a maximum rating of $\Delta i/\Delta t$, supplied by the manufacturer of the freewheel diode 16, should not be exceeded. However, recovery current is less intensive at turn-on of the power electronic switch 18. Consequently, the compensation circuit 310 is tailored to provide faster switching at turn-on when compared to turn-off switching time.

Polarities of voltages $V_{Ls}$ and $V_{Le}$ are reversed when compared to the shown polarities of FIG. 16. The voltage at the emitter 24 is now higher than the ground reference 302. The turn-on diode $D_{on}$ now being forward polarized becomes (essentially) a short-circuit, placing $R_{eON}$ in parallel with $R_{e1}$. This reduces the gain G of the gain adaptor, now calculated according to equation (2):

$$G = \frac{\left(\frac{ReON \cdot Re1}{ReON + Re1}\right)}{\left(\left(\frac{ReON \cdot Re1}{ReON + Re1}\right) + Re2\right)} \quad (2)$$

It may be observed that, for any value of $R_{eON}$, $R_{e1}$ and $R_{e2}$, the gain of equation 2 is lower than the adapter gain of FIG. 17 because the equivalent resistance of $R_{e1}$ and $R_{eON}$ placed in parallel is lower than the resistance value $R_{e1}$. It may also be observed that if $R_{e1}$ is shorted (equivalent to setting $R_{eON}$ to zero ohm), no part of $V_{Le}$ is applied to the gate 26 of the power electronic switch 18 at turn-on, in which case no feedback of $V_{Le}$ is provided by the compensation circuit 310 to the power electronic switch 18. The gate resistor $R_g$ becomes the only limitation for the di/dt and has then a higher value.

Turning on the power electronic switch 18 involves setting the output 46 of the gate driver 40 to the positive supply voltage 42, at $+V_{cc}$, this voltage also being applied at the gate 26 as soon as current from the output 46 of the gate driver 40, through $R_g$, has charged the parasitic capacitance $C_{ge}$ present between the gate 26 and the emitter 24. Additionally, the voltage across the emitter parasitic inductance 30 is multiplied by the gain G of equation 2 and applied to the gate driver 40 via the common ground connection. Because the gain G of equation 2 is lower than the gain applicable at turn-off of the power electronic switch 18, the feedback provided by the compensation circuit 110 is less important at turn-on when compared to turn-off.

Figure 18:
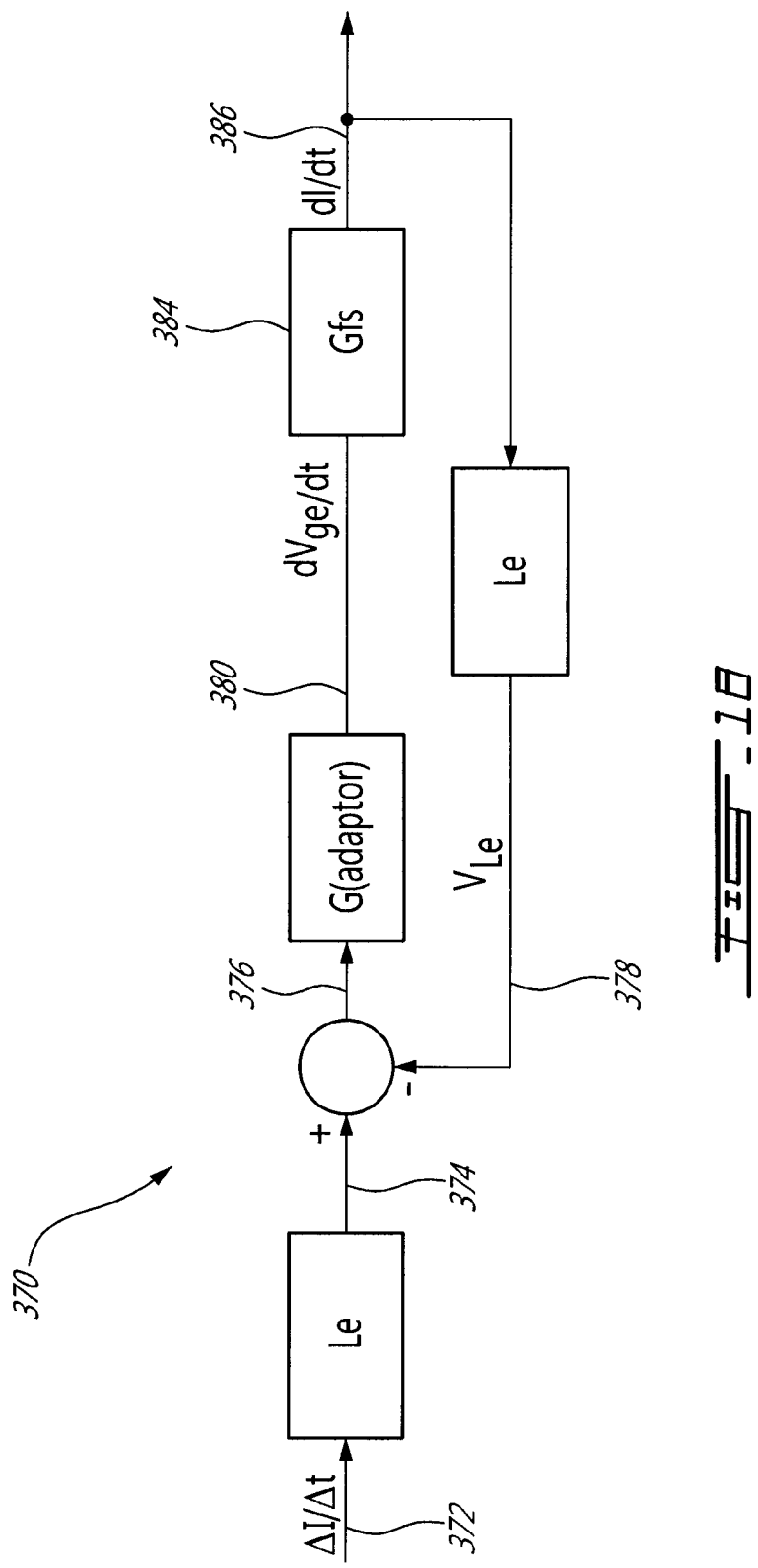
FIG. 18 is a small signal control loop model of the commutation cell of FIG. 16 at turn-on of the power electronic switch.

FIG. 18 is a small signal control loop model of the commutation cell of FIG. 16 at turn-on of the power electronic switch. Because it is desirable to control the recovery current this time, a small signal model 370 uses the maximum rating of $\Delta i/\Delta t$ for the recovery current through the freewheel diode 16 as a set-point 372. This translates into a voltage set-point 374, which is a maximum allowed voltage across the emitter inductance 30. A small signal difference 376 (near zero volt) between the set-point 374 and the actual value 378 of $V_{Le}$ (having reverse polarity compared to the value 358 of FIG. 17) is multiplied by the gain G of the adaptor as defined in equation (2), providing a voltage 360 across the resistors $R_{e1}$ and $R_{eON}$, which are in parallel, and across the gate 26 and emitter 24 of the power electronic switch 18. This voltage varies over time as the current causing the voltage 378 also varies. This voltage variation is expressed as $dV_{ge}/dt$. Given a transconductance 384 of the power electronic switch 18, having a value $G_{fs} = di/dV_{ge}$, a variation of current 386 (di/dt) is obtained. The actual value of $V_{Le}$ 378 is equal to the value Le of the emitter inductance 30 times the variation of current 386 (di/dt).

Placement within the compensation circuit 310 of the turn-on diode 118 ensures the activation of the resistance $R_{eON}$ solely during turn-on of the power electronic switch 18. Consequently, control of $V_{ge}$ and of the rate at which the power electronic switch 18 turns on is made to differ from the rate at which the power electronic switch 18 turns off.

Figure 19:
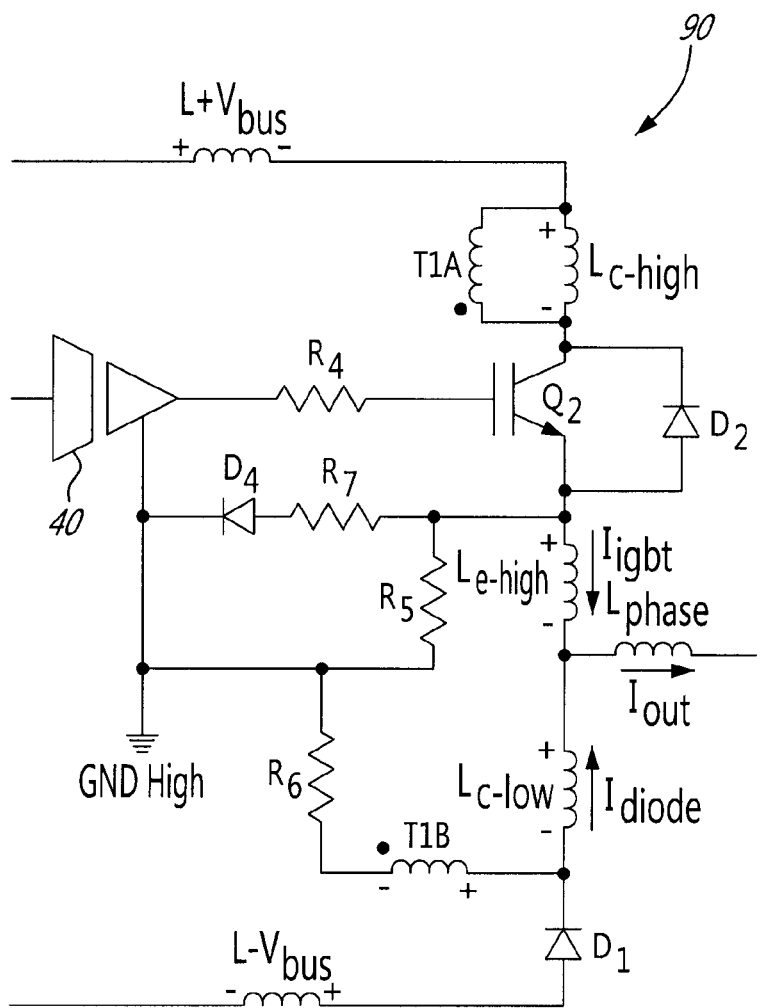
FIG. 19 is a partial circuit diagram of an IGBT leg that incorporates the circuit for limiting turn-off overvoltage and turn-on recovery current of FIG. 16.

FIG. 19 is a partial circuit diagram of an IGBT leg that incorporates the circuit for limiting turn-off overvoltage and turn-on recovery current of FIG. 16. FIG. 19 shows the polarity of the voltage induced across the different parasitic inductances when the top IGBT $Q_2$ is turned on. The bottom IGBT $Q_1$ is open circuit. It has been shown in FIG. 15 that the current increases during a first part of the turn-on process, the current being deviated from the opposite freewheel diode $D_1$ to the top IGBT $Q_2$. The polarities of the voltages induced across the parasitic inductances are in the same direction as the di/dt of the high frequency loop. The voltage applied to the emitter of the top IGBT $Q_2$ is the sum of the voltage across $T_{1B}$, $L_{c\text{-}low}$ and $L_{e\text{-}high}$ minus the voltage across resistor $R_6$, the voltage across $T_{1B}$ being the mirror of the voltage across $L_{c\text{-}high}$. All these voltages apply a positive voltage at the emitter of the top IGBT $Q_2$ proportional to the di/dt to limit the voltage rise of the gate-emitter $V_{ge}$ of the top IGBT $Q_2$ in order to limit the di/dt.

The circuit of FIG. 19 also incorporates elements introduced in the foregoing description of FIG. 16, a diode $D_4$ becoming conductive and allowing current to flow through resistor $R_7$, placing $R_7$ in parallel with R5 upon turning off of the top IGBT $Q_2$, when the voltage at the emitter of the top IGBT $Q_2$ is higher than the voltage at the reference of its gate driver 40. The present technology can thus be tuned to control both turn-off and turn-on of the IGBTs.

Figure 20:
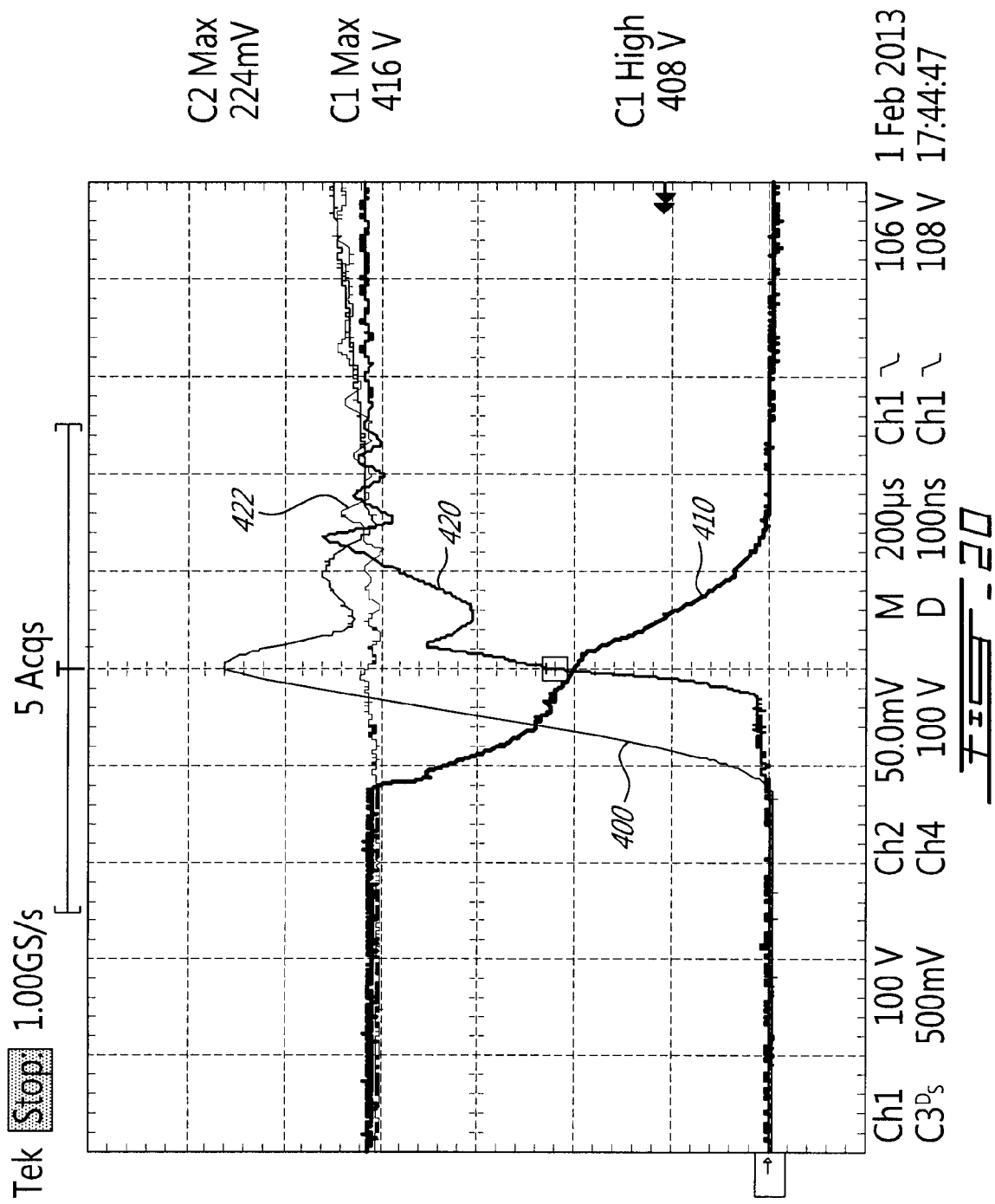
FIG. 20 is a graphic illustrating recovery current of a freewheel diode without the circuit for limiting turn-off overvoltage and turn-on recovery current, with a very high di/dt.

FIG. 20 is a graphic illustrating recovery current of a freewheel diode without the circuit for limiting turn-off overvoltage and turn-on recovery current, with a very high di/dt. In this graph, the di/dt of the current 400 through the freewheel diode $D_2$ reaches over 6 kA/μsec, exceeding the manufacturer's recommendation of 5.5 kA/μsec. The voltage 410 across the stray inductances of the high frequency loop is the mirror of the di/dt, i.e. the voltage across the IGBT, is below the bus voltage $V_{bus}$ during the current rise. Without the present technology, the di/dt keeps increasing until the freewheel diode spontaneously turns off. The dv/dt of the voltage 420 across the freewheel diode is very high and has significant oscillations 422 that cause electromagnetic interference (EMI).

Figure 21:
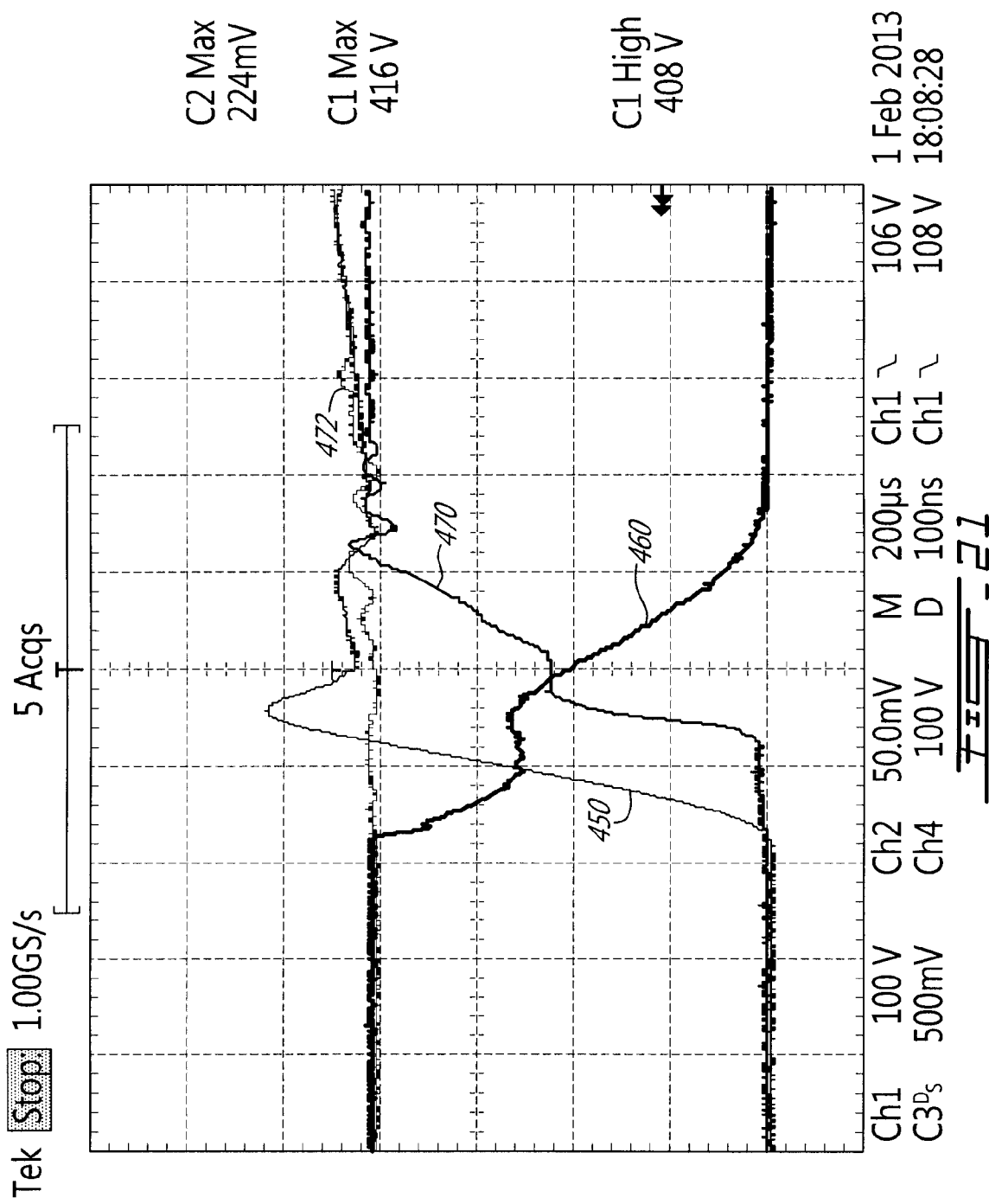
FIG. 21 is a graphic illustrating recovery current of the freewheel diode of FIG. 19.

FIG. 21 is a graphic illustrating recovery current of the freewheel diode of FIG. 19. By comparison with the graph of FIG. 20, the recovery current is controlled using the present technology. In this case, di/dt of the current 450 across the freewheel diode $D_2$ is maintained within the manufacturer recommendation of 5 kA/μsec when the diode turns off. In fact, the di/dt is actually greater (steeper slope) at the beginning of the transition, but is timely reduced to the desired value to protect the device. The voltage 460 across the stray inductances of the high frequency loop reduces less rapidly. The recovery current is lower when compared to FIG. 20. The voltage rise 470 is lower, and the oscillations 472 are reduced.

Figure 22:
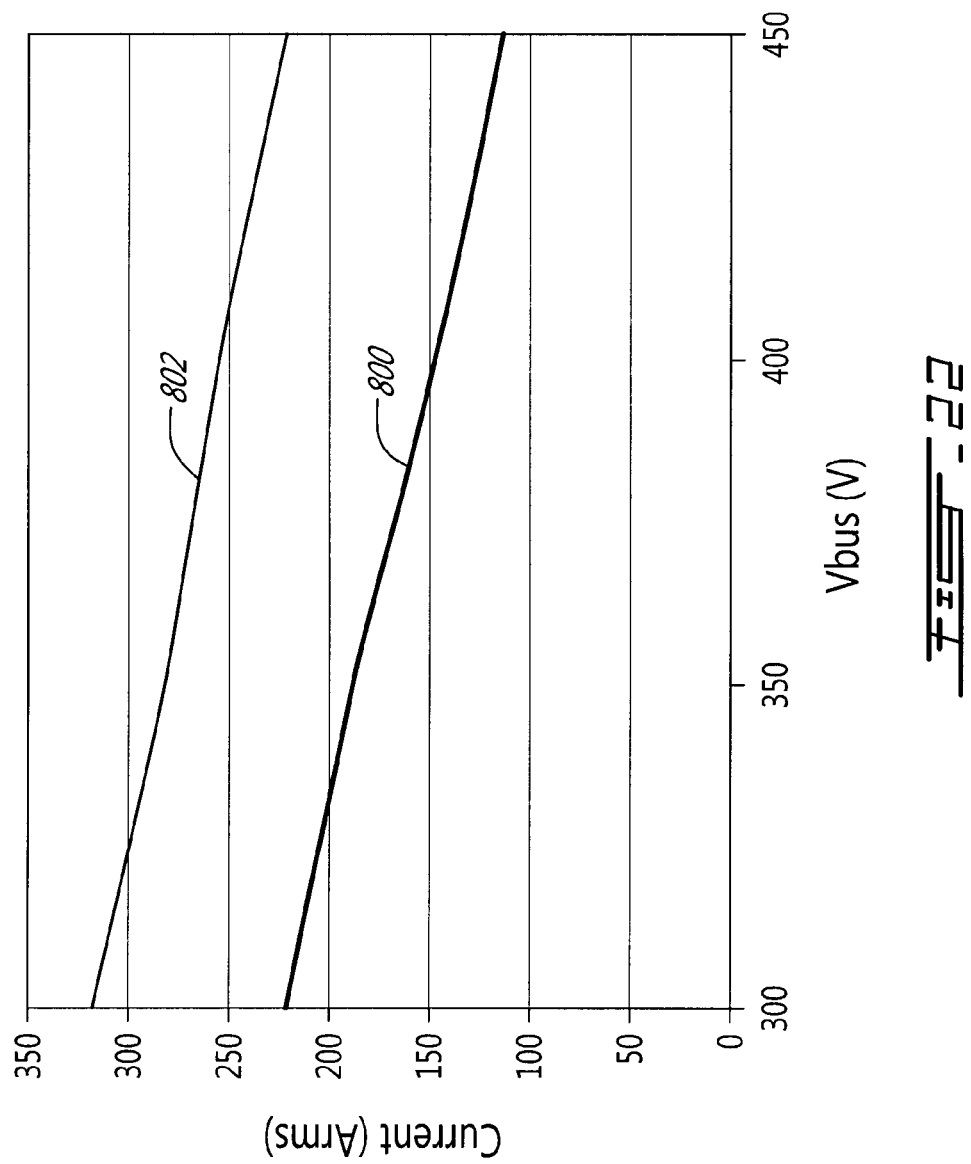
FIG. 22 is a graphic illustrating a comparison of output currents as a function of bus voltages that can be provided with and without the circuit for limiting turn-off overvoltage and turn-on recovery current.

Experimental measurements were obtained in a laboratory, under the same conditions, with and without the above described technology. FIG. 22 is a graphic illustrating a comparison of output currents as a function of bus voltages that can be provided with and without the circuit for limiting turn-off overvoltage and turn-on recovery current. FIG. 22 shows a comparison of output currents that can be provided with an HP2 IGBT module from Infineon™ with a cooling liquid at 55° C. and a hottest junction of all the dies at 130° C. Many drives, such as for example those developed for vehicular applications, should resist any short-circuit condition. Usually, tests are performed until the IGBT desaturates. For the purpose of this experiment leading whose results are shown on FIG. 22, a maximum peak output current of 2000 amperes was considered. The overvoltage was maintained within 650 Vdc for all possible currents up to 2000 amperes. The gate drivers were adjusted according to these requirements. For gate drivers without the present technology, the on and off resistor values were adjusted.

FIG. 22 illustrates root-mean-square (RMS) output currents as a function of bus voltage. The operating frequency was 20 KHz, without any modulation in both cases. The capability to provide the desired output current is affected by the operating voltage. Measurements were taken at voltages ranging from 300 Vdc to 450 Vdc. Results using the gate driver without the present technology (numeral 800) could only give half of the output current at 450 Vdc when compared to 300 Vdc. Results using the gate driver with the present technology (numeral 802), on the other hand, could give more than two thirds of the output current at 450 Vdc when compared to 300 Vdc. The present technology not only helps to increase the output current for a same given semiconductor configuration, but is also less sensitive to operating voltages. On FIG. 22, the slope of the output current loss with increasing bus voltage is lower with the present technology. This result therefore shows that the present technology makes a commutation cell less dependent on the switching losses.

Figure 23:
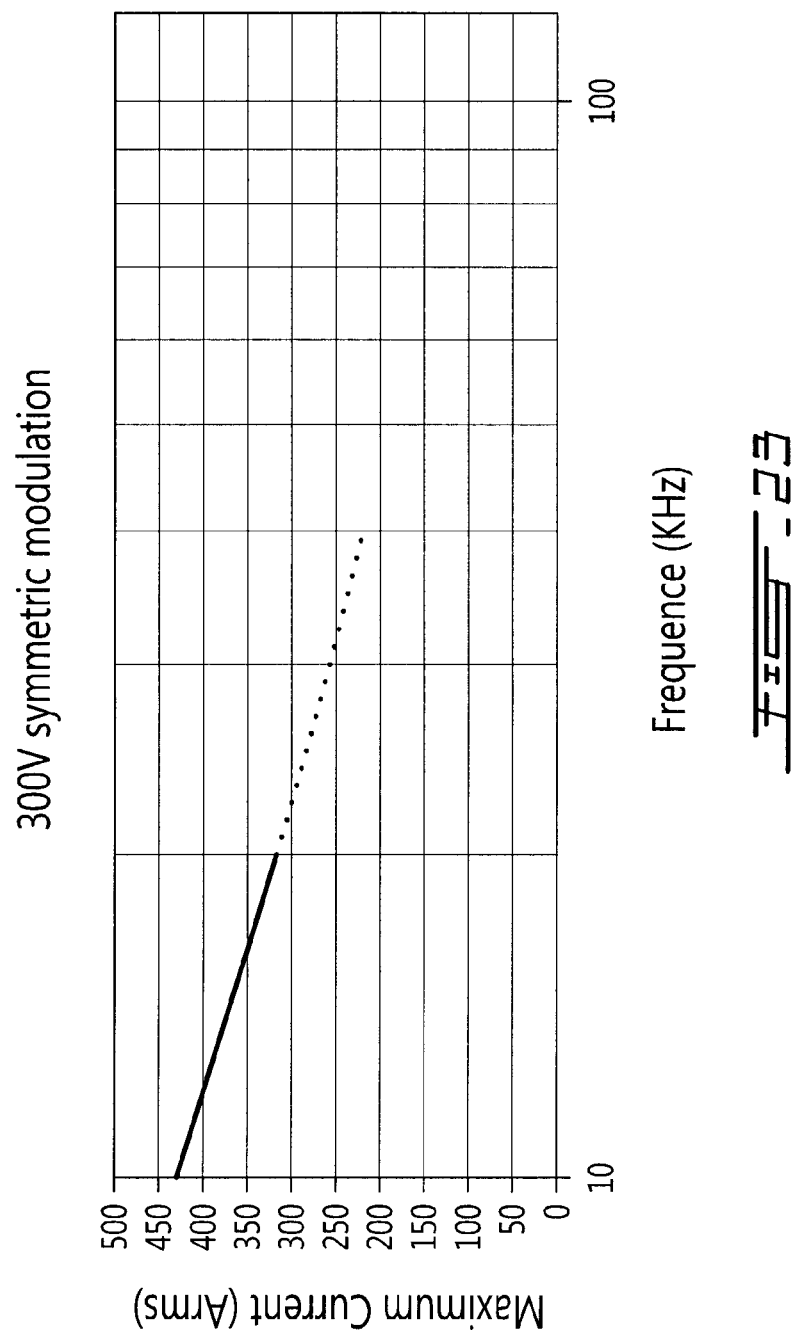
FIG. 23 is a graphic illustrating the output current as a function of switching frequency using the circuit for limiting turn-off overvoltage and turn-on recovery current.

FIG. 23 is a graphic illustrating the output current as a function of switching frequency using the circuit for limiting turn-off overvoltage and turn-on recovery current. The same experimental conditions used to produce the results shown on FIG. 22 were repeated when producing the graph of FIG. 23. A 300 Vdc bus voltage was maintained and the results are provided as a function of the frequency. Using a logarithmic scale, with these experimental measurements, it is expected that the HP2 IGBT module from Infineon™ will be able to operate at 40 KHz and provide over 200 amperes.

The foregoing describes solutions applicable to DC-DC converters and to DC-AC converters, for example commutation cells using a full leg of semiconductors, opposite pairs of power electronic switches and freewheel diodes, to provide alternative current to a connected load such as a motor of an electric vehicle.

Those of ordinary skill in the art will realize that the description of the commutation cell and of the compensation circuit for limiting switching overvoltage and for limiting recovery current are illustrative only and are not intended to be in any way limiting. Other embodiments will readily suggest themselves to such persons with ordinary skill in the art having the benefit of the present disclosure. Furthermore, the disclosed commutation cell and the compensation circuit may be customized to offer valuable solutions to existing needs and problems of overvoltage and recovery current occurring upon switching in commutation cells.

In the interest of clarity, not all of the routine features of the implementations of commutation cell and of the compensation circuit are shown and described. It will, of course, be appreciated that in the development of any such actual implementation of the commutation cell and of the compensation circuit, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of power electronics having the benefit of the present disclosure.

It is to be understood that the commutation cell and compensation circuit for limiting switching overvoltage and for limiting recovery current is not limited in its application to the details of construction and parts illustrated in the accompanying drawings and described hereinabove. The proposed commutation cell and compensation circuit for limiting switching overvoltage and for limiting recovery current is capable of other embodiments and of being practiced in various ways. It is also to be understood that the phraseology or terminology used herein is for the purpose of description and not limitation. Hence, although the commutation cell and compensation circuit for limiting switching overvoltage and for limiting recovery current has been described hereinabove by way of illustrative embodiments thereof, it can be modified, without departing from the spirit, scope and nature of the subject invention.

What is claimed is:

1. A commutation cell configured for limiting switching overvoltage and for limiting recovery current, comprising:
a power electronic switch having a parasitic emitter inductance through which a voltage is generated upon turning on and off of the power electronic switch;
a compensation circuit, connected in parallel across the parasitic emitter inductance, the compensation circuit comprising a voltage divider having a first and a second resistor and a turn-on diode connected in series with a third resistor connected in parallel with the first resistor of the voltage divider and being so configured that the turn-on diode is non-conductive at turn-off of the power electronic switch so as to apply a sample of the voltage generated through a parasitic emitter inductance using a first gain value defined by the first resistor and the second resistor at turn-off and the diode is conductive at turn-on of the power electronic switch such that the third resistor is in parallel with the first resistor such that a second gain value defined by the first resistor, the second resistor, and the third resistor, lower than the first gain value and greater than zero at turn-on of the power electronic switch to control the voltage generated through the parasitic emitter inductance.

2. The commutation cell of claim 1, wherein the power electronic switch is selected from an isolated gate bipolar transistor, a metal-oxide-semiconductor field-effect transistor and a bipolar transistor.

3. The commutation cell of claim 1, further comprising a freewheel diode operating in tandem with the power electronic switch.

4. The commutation cell of claim 1, further comprising a gate driver connected to the compensation circuit and to a gate of the power electronic switch, the gate driver controlling a gate to emitter voltage applied to the power electronic switch.

5. The commutation cell of claim 4, wherein the gate driver includes a reference and wherein the sample of the voltage generated through the parasitic emitter inductance is added between the reference of the gate driver and the gate of the power electronic switch.

6. A power converter, comprising:
a leg having two commutation cells, each commutation cell comprising:
a power electronic switch having a parasitic emitter inductance through which a voltage is generated upon turning on and off of the power electronic switch; and
a compensation circuit connected to the parasitic emitter inductance, the compensation circuit comprising a voltage divider having a first and a second resistor and a diode connected in series with a third resistor connected in parallel with the first resistor of a voltage divider and being so configured for applying a sample of the voltage generated through the parasitic emitter inductance using a first gain value at turn-off and a second gain value, lower than the first gain value and greater than zero at turn-on of the power electronic switch to control the voltage generated through the parasitic emitter inductance, and
wherein the two commutation cells form a loop and are connected at a junction of a collector of a first power electronic switch of a first commutation cell and of an emitter of a second power electronic switch of a second commutation cell.

7. The power converter of claim 6, comprising a transformer having a primary connected in parallel to a parasitic collector inductance of the second power electronic switch, the transformer also having a secondary connected in series with the parasitic emitter inductance of the second power electronic switch and with the compensation circuit of the second commutation cell.

8. The power converter of claim 6, further comprising a large connector forming the junction of the collector of the first power electronic switch and of the emitter of the second power electronic switch, the large connector providing a large parasitic emitter inductance of the second power electronic switch for limiting an overvoltage of the second power electronic switch.

9. The power converter of claim 6, comprising three legs, whereby the power converter is a three-phase power converter.

10. The power converter of claim 8, comprising a circuit board having pads for mounting the collector of the first power electronic switch and the emitter of the second power electronic switch, the large connector having a generally Li-shaped cross-section having legs connected to the pads and a central section bridging the legs.

11. A compensation circuit for limiting switching overvoltage on
a power electronic switch of a commutation cell, the commutation cell including a high frequency loop having a parasitic inductance through which a voltage is generated upon turning off of the power electronic switch, the high frequency loop parasitic inductance including a parasitic emitter inductance of the power electronic switch, the compensation circuit comprising:
a voltage divider having a first and second resistor;
a diode connected in series with a third resistor connected in parallel with the first resistor of the voltage divider;
a voltage divider configured to provide a first gain of a voltage generated on the parasitic emitter inductance at turn-off and a second gain value, lower than the first gain value and greater than zero, of the voltage generated on the parasitic emitter inductance at turn-on of the power electronic switch using an additional voltage drop in parallel with a portion of the voltage divider; and
a connection from the voltage divider to provide a feedback voltage to the power electronic switch gate driver according to the gain to reduce the voltage generated on the parasitic inductance of the high frequency loop.

12. The compensation circuit of claim 11, comprising:
a turn-on diode adapted to reconfigure the voltage divider to provide the first and second gains of the voltage generated on the parasitic emitter inductance;
wherein a feedback voltage provided to the power electronic switch gate driver with the second gain of the voltage divider reduces a recovery current in the freewheel diode of the commutation cell.

13. The compensation circuit of claim 11, wherein the first gain value is greater than the second gain and wherein the first and second gains are both greater than zero.

* * * * *